(12) United States Patent
Shimura et al.

(10) Patent No.: US 11,196,406 B2
(45) Date of Patent: Dec. 7, 2021

(54) VIBRATOR DEVICE, METHOD OF MANUFACTURING VIBRATOR DEVICE, ELECTRONIC APPARATUS, AND VEHICLE

(71) Applicant: SEIKO EPSON CORPORATION, Tokyo (JP)

(72) Inventors: Masashi Shimura, Chino (JP); Atsushi Matsuo, Shiojiri (JP); Shinya Aoki, Minowa-machi (JP); Shiro Murakami, Shiojiri (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 444 days.

(21) Appl. No.: 16/201,213

(22) Filed: Nov. 27, 2018

(65) Prior Publication Data
US 2019/0165760 A1  May 30, 2019

(30) Foreign Application Priority Data

Nov. 28, 2017 (JP) .............................. JP2017-228419

(51) Int. Cl.
| | |
|---|---|
| *H03H 9/13* | (2006.01) |
| *H03H 3/04* | (2006.01) |
| *H03H 9/02* | (2006.01) |
| *H03H 9/05* | (2006.01) |
| *H03H 9/19* | (2006.01) |
| *H03H 9/10* | (2006.01) |
| *B60R 16/03* | (2006.01) |
| *H04N 5/225* | (2006.01) |
| *G06F 1/16* | (2006.01) |

(52) U.S. Cl.
CPC .............. *H03H 9/132* (2013.01); *H03H 3/04* (2013.01); *H03H 9/02133* (2013.01); *H03H 9/0519* (2013.01); *H03H 9/0552* (2013.01); *H03H 9/1021* (2013.01); *H03H 9/19* (2013.01); *B60R 16/03* (2013.01); *G06F 1/1616* (2013.01); *G06F 1/1681* (2013.01); *H03H 2003/0457* (2013.01); *H04N 5/2251* (2013.01)

(58) Field of Classification Search
CPC .. H03H 9/132; H03H 9/02133; H03H 9/0519; H03H 9/0552; H03H 9/19; H03H 9/1021; H03H 3/04
See application file for complete search history.

(56) References Cited

U.S. PATENT DOCUMENTS

| | | | |
|---|---|---|---|
| 6,229,249 B1 | 5/2001 | Hatanaka et al. | |
| 2013/0221801 A1* | 8/2013 | Shimodaira | H01L 41/0475 310/317 |

(Continued)

FOREIGN PATENT DOCUMENTS

| | | | |
|---|---|---|---|
| JP | 2000-151283 A | 5/2000 | |
| JP | 2006-303919 A | 11/2006 | |

*Primary Examiner* — Jeffrey M Shin
(74) *Attorney, Agent, or Firm* — Rankin, Hill & Clark LLP

(57) ABSTRACT

A vibrator device includes a base, a circuit element that is attached to the base, and a vibrator element that is arranged at an active surface of the circuit element and is attached to the circuit element, and the circuit element includes a terminal for frequency adjustment that is used for frequency adjustment of the vibrator element and is disposed in a region that does not overlap the vibrator element when viewed in a plan view of the active surface.

11 Claims, 17 Drawing Sheets

(56) References Cited

U.S. PATENT DOCUMENTS

2013/0328444 A1* 12/2013 Aoki ................. G01C 19/5621
                                                    310/312
2015/0280719 A1* 10/2015 Isohata ................. H03L 1/022
                                                    331/66

* cited by examiner

VIBRATOR DEVICE, METHOD OF MANUFACTURING VIBRATOR DEVICE, ELECTRONIC APPARATUS, AND VEHICLE

BACKGROUND

1. Technical Field

The present invention relates to a vibrator device, a method of manufacturing a vibrator device, an electronic apparatus, and a vehicle.

2. Related Art

A vibrator device disclosed in JP-A-2006-303919 includes a package, and a vibrator element and an IC chip accommodated in the package. The vibrator element is irradiated with an ion beam in a state where the vibrator element and the IC chip are disposed in the package, to perform frequency adjustment of the vibrator element.

However, in the vibrator device disclosed in JP-A-2006-303919, the vibrator element and the IC chip are independently disposed in the package, and are electrically connected to each other through a wiring of the package. For this reason, it is only possible to perform the frequency adjustment of the vibrator element in a state where the vibrator element and the IC chip are disposed in the package. Thus, when the resonance frequency of the vibrator element is out of a standard, both the IC chip and the package become useless, which leads to an increase in manufacturing costs.

SUMMARY

An advantage of some aspects of the invention is to provide a vibrator device capable of adjusting the resonance frequency of a vibrator element before the vibrator element is disposed in a package and achieving a reduction in manufacturing costs, a method of manufacturing a vibrator device, an electronic apparatus, and a vehicle.

The invention can be implemented as the following application examples.

A vibrator device according to an application example includes a base, a circuit element that is attached to the base, and a vibrator element that is arranged at an active surface of the circuit element and is attached to the circuit element, in which the circuit element includes a terminal for frequency adjustment that is used for frequency adjustment of the vibrator element and is disposed in a region that does not overlap the vibrator element when viewed in a plan view of the active surface.

With this configuration, the oscillation frequency of the vibrator element can be monitored through the terminal for frequency adjustment, and thus it is possible to adjust the frequency of the vibrator element before the vibrator element is accommodated in a package. For this reason, at least the package is not wasted even when the frequency of the vibrator element is out of a standard, and thus it is possible to achieve a reduction in manufacturing costs.

In the vibrator device according to the application example, it is preferable that the terminal for frequency adjustment is positioned on an outer region of the vibrator element when viewed in the plan view.

With this configuration, it is easy to press a probe against the terminal for frequency adjustment.

It is preferable that the vibrator device according to the application example further includes a relay substrate that is positioned between the circuit element and the vibrator element, in which the vibrator element is attached to the circuit element through the relay substrate.

With this configuration, stress is hardly transmitted to the vibrator element, and thus it is possible to exhibit excellent vibration characteristics.

In the vibrator device according to the application example, it is preferable that the relay substrate includes a first portion that is attached to the base, a second portion, a first beam portion that connects the first portion and the second portion to each other on a first axis, a third portion, and a second beam portion that connects the second portion and the third portion to each other on a second axis intersecting the first axis, and the vibrator element is attached to the third portion.

With this configuration, stress is more hardly transmitted to the vibrator element.

It is preferable that the vibrator device according to the application example further includes a lid body that is bonded to the base so as to accommodate the vibrator element and the circuit element between the base and the lid body.

With this configuration, it is possible to protect the vibrator element and the circuit element from moisture, dust, an impact, and the like.

A method of manufacturing a vibrator device according to an application example includes preparing a circuit element in which a terminal for frequency adjustment that is used for frequency adjustment of a vibrator element is disposed on an active surface, and disposing the vibrator element on the active surface so as not to overlap the terminal for frequency adjustment when viewed in a plan view of the active surface, and processing an excitation electrode included in the vibrator element to adjust frequency of the vibrator element.

With this configuration, the frequency of the vibrator element is adjusted before the vibrator element is accommodated in the package. Accordingly, even when the frequency of the vibrator element is out of a standard, at least the package is not wasted, and thus it is possible to achieve a reduction in manufacturing costs.

It is preferable that the method of manufacturing a vibrator device according to the application example further includes, prior to the disposing of the vibrator element on the circuit element, preparing a substrate on which the vibrator element is formed, processing the excitation electrode to adjust the frequency of the vibrator element, and separating the vibrator element from the substrate.

With this configuration, it is possible to adjust the frequency of the vibrator element before the vibrator element is disposed on the circuit element and to adjust the frequency of the vibrator element after the vibrator element is disposed on the circuit element. For this reason, it is possible to reduce the amount of processing of the excitation electrode in a state where the vibrator element is disposed on the circuit element, and to reduce damage on the circuit element.

In the method of manufacturing a vibrator device according to the application example, it is preferable that the vibrator element includes a vibration substrate, a first excitation electrode disposed on one principal surface of the vibration substrate, and a second excitation electrode disposed on the other principal surface, the adjusting of the frequency of the vibrator element in a state where the vibrator element is disposed on the substrate includes processing the first excitation electrode, and the adjusting of the frequency of the vibrator element in a state where the vibrator element is disposed on the circuit element includes processing the second excitation electrode.

With this configuration, it is possible to reduce a difference in mass between the first and second excitation electrodes.

In the method of manufacturing a vibrator device according to the application example, it is preferable that the disposing of the vibrator element on the circuit element includes preparing a relay substrate and disposing the vibrator element on the circuit element through the relay substrate.

With this configuration, stress is hardly transmitted to the vibrator element, and thus the vibrator device having excellent vibration characteristics is obtained.

It is preferable that the method of manufacturing a vibrator device according to the application example further includes disposing the circuit element on a base after the frequency of the vibrator element is adjusted in a state where the vibrator element is disposed on the circuit element, and bonding a lid body to the base so as to accommodate the circuit element and the vibrator element between the base and the lid body.

With this configuration, it is possible to protect the vibrator element and the circuit element from moisture, dust, an impact, and the like.

An electronic apparatus according to an application example includes the vibrator device according to the above-described application example.

With this configuration, it is possible to enjoy the effect of the vibrator device of the above-described application example, and thus the electronic apparatus having high reliability is obtained.

A vehicle according to an application example includes the vibrator device according to the above-described application example.

With this configuration, it is possible to enjoy the effect of the vibrator device of the above-described application example, and thus the vehicle having high reliability is obtained.

BRIEF DESCRIPTION OF THE DRAWINGS

The invention will be described with reference to the accompanying drawings, wherein like numbers reference like elements.

DESCRIPTION OF EMBODIMENTS

Hereinafter, a vibrator device, a method of manufacturing a vibrator device, an electronic apparatus, and a vehicle according to the invention will be described in detail on the basis of embodiments illustrated in the accompanying drawings.

First Embodiment

Figure 1:
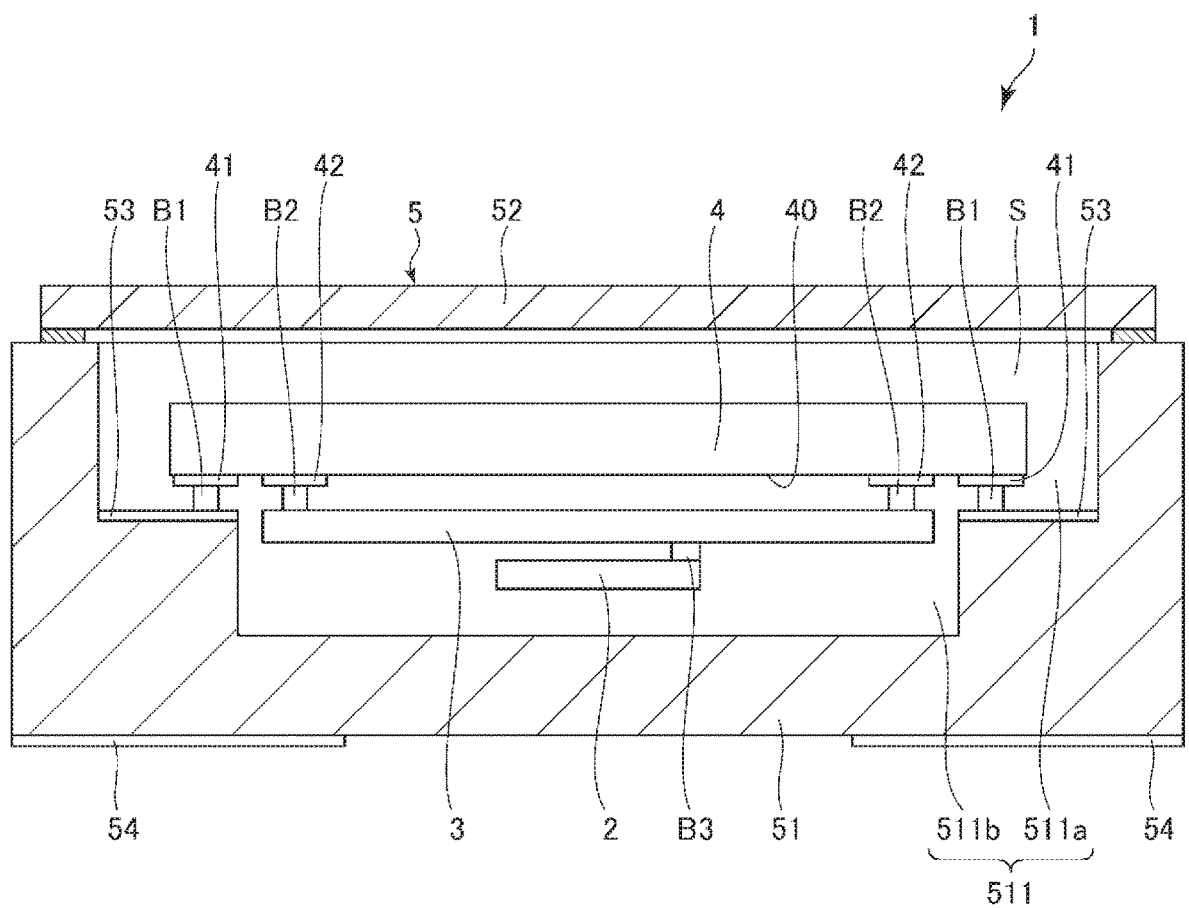
FIG. 1 is a cross-sectional view illustrating a vibrator device according to a first embodiment of the invention.
Figure 2:
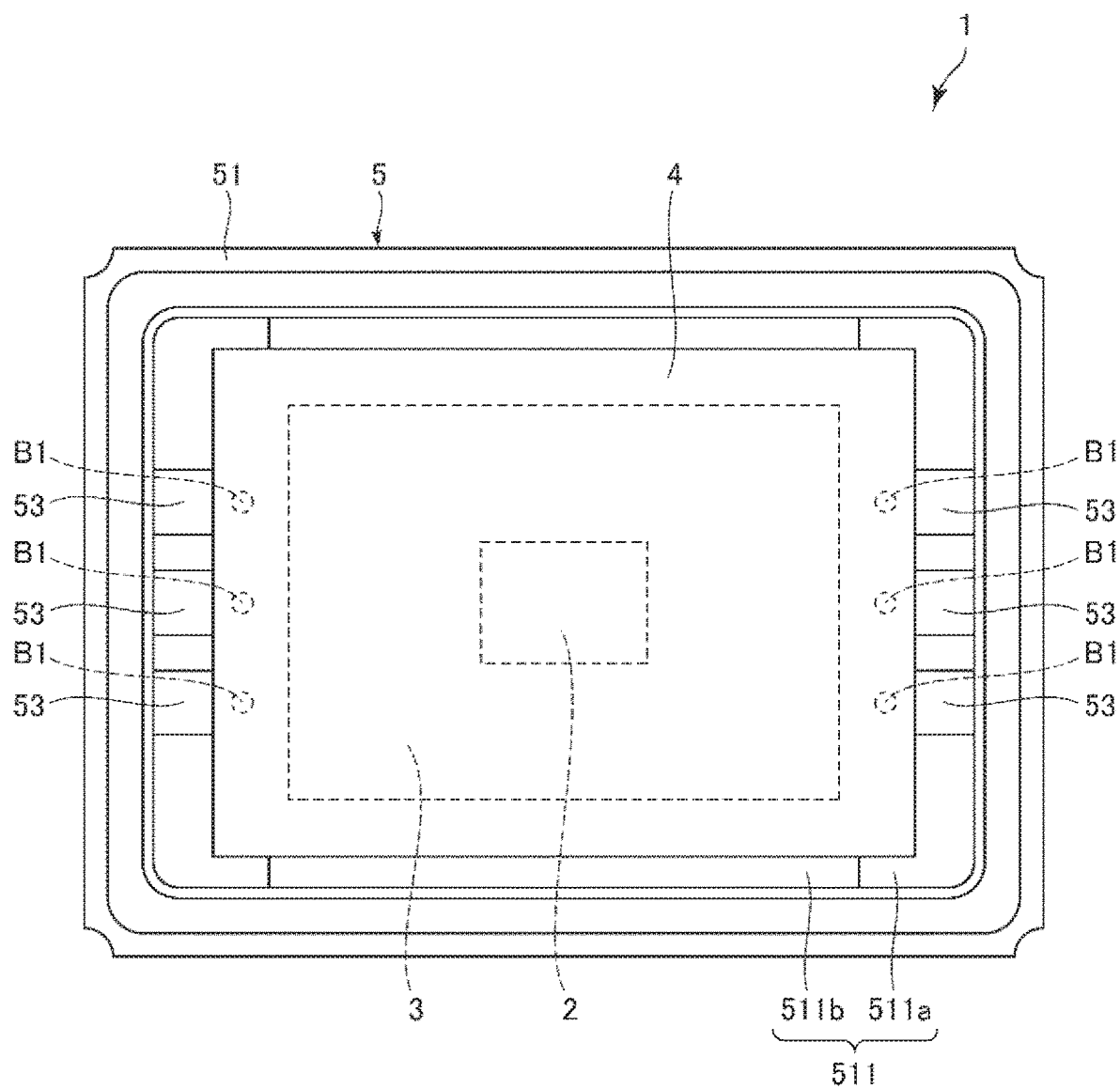
FIG. 2 is a top view illustrating the vibrator device of FIG. 1.
Figure 3:
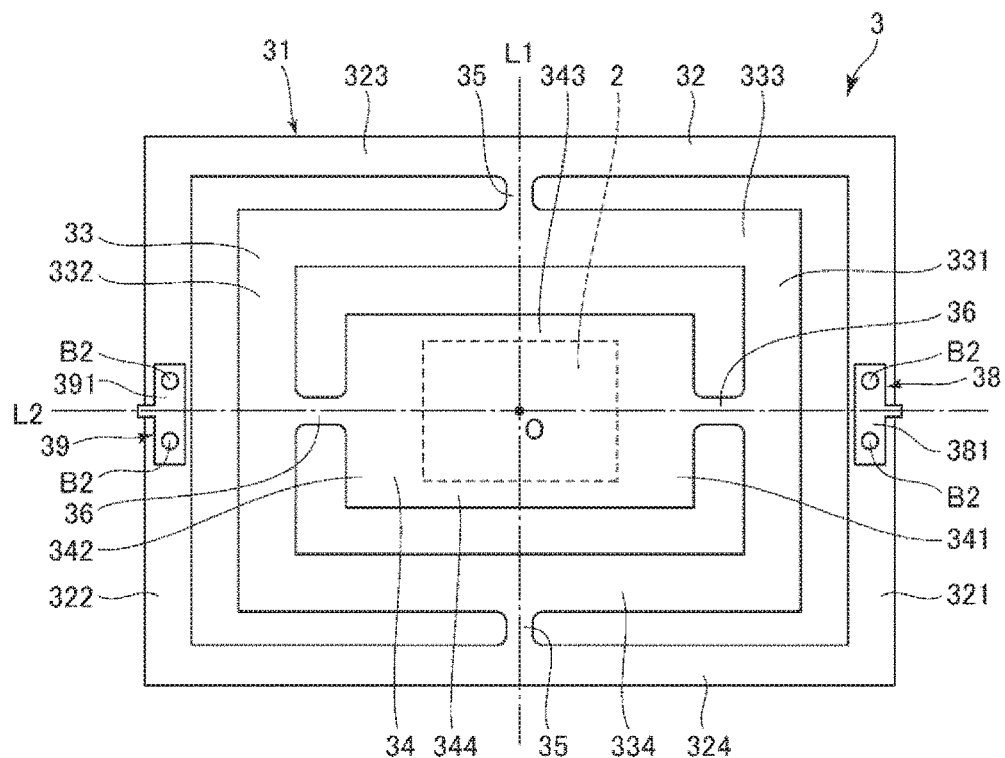
FIG. 3 is a top view illustrating a relay substrate.
Figure 4:
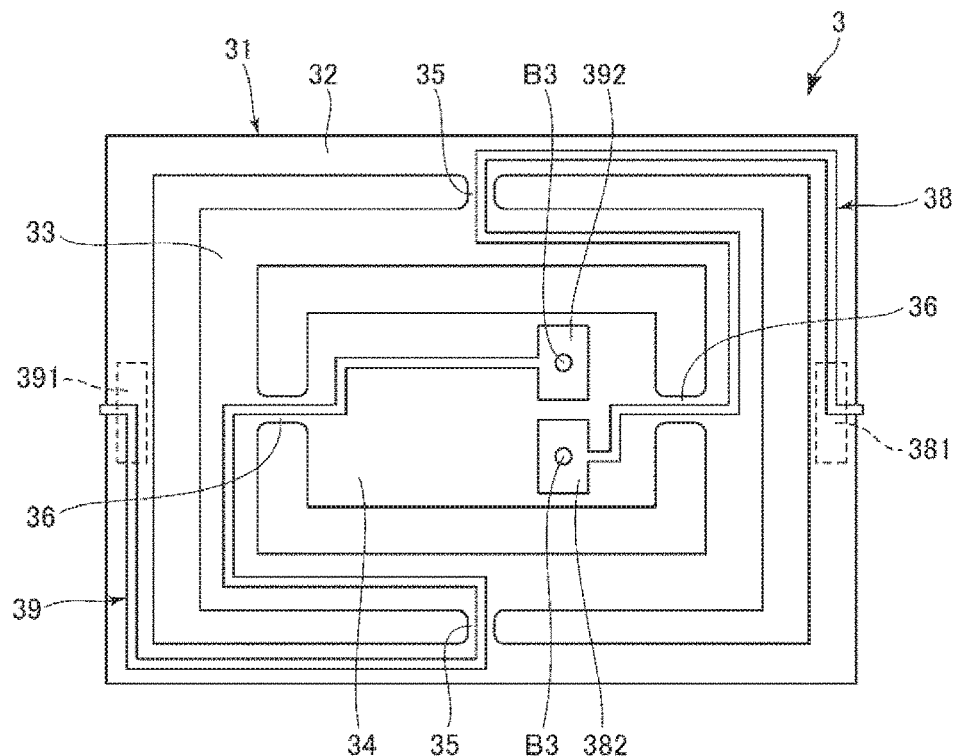
FIG. 4 is a bottom view illustrating the relay substrate.
Figure 5:
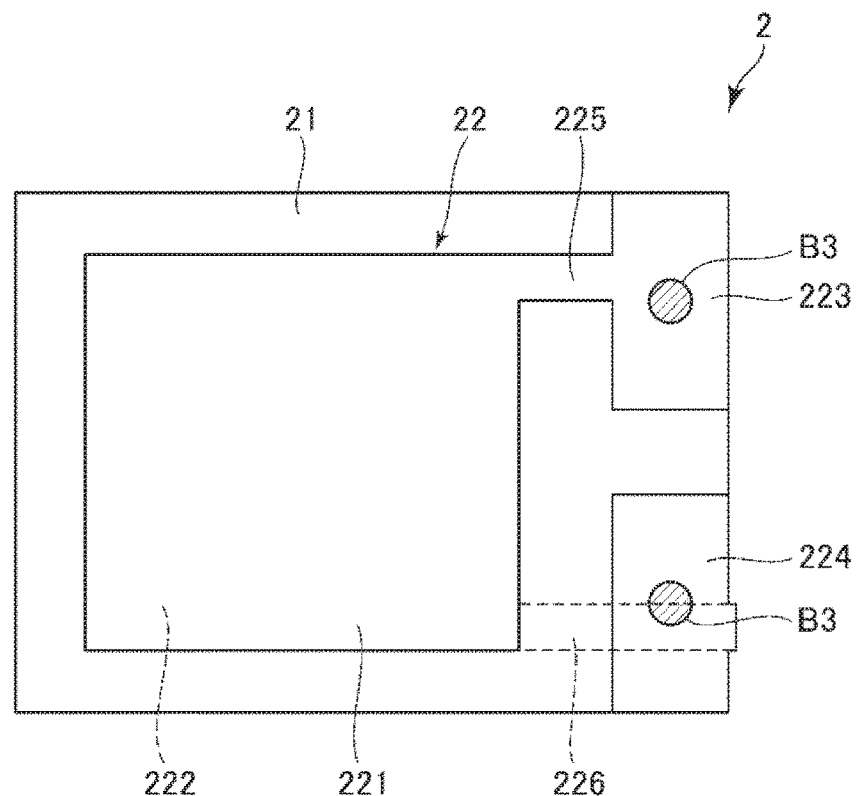
FIG. 5 is a top view illustrating a vibrator element.
Figure 6:
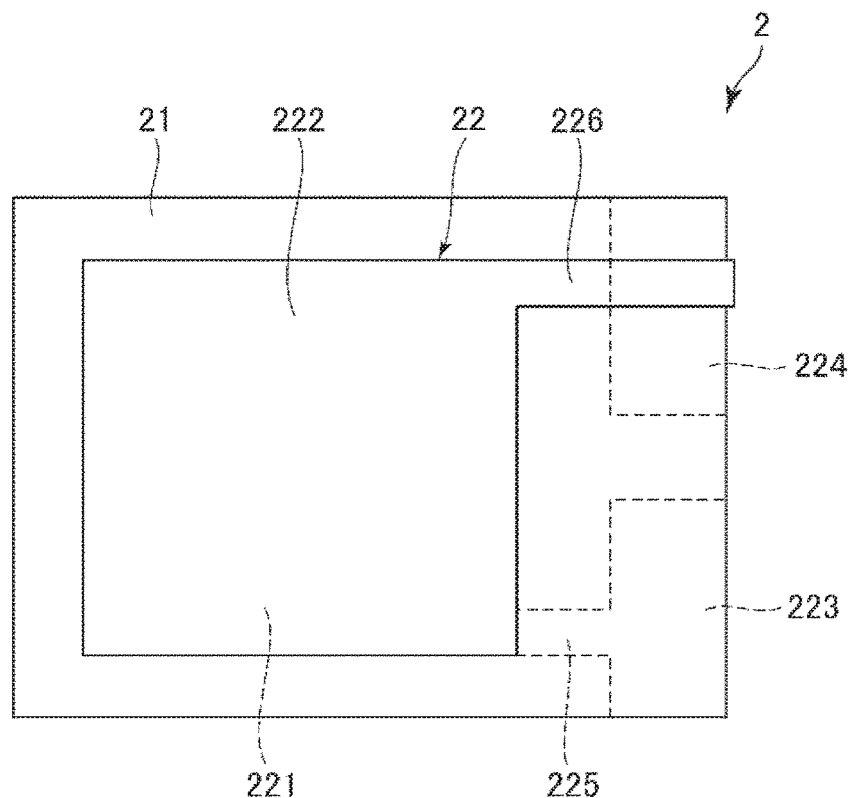
FIG. 6 is a bottom view illustrating the vibrator element.
Figure 7:
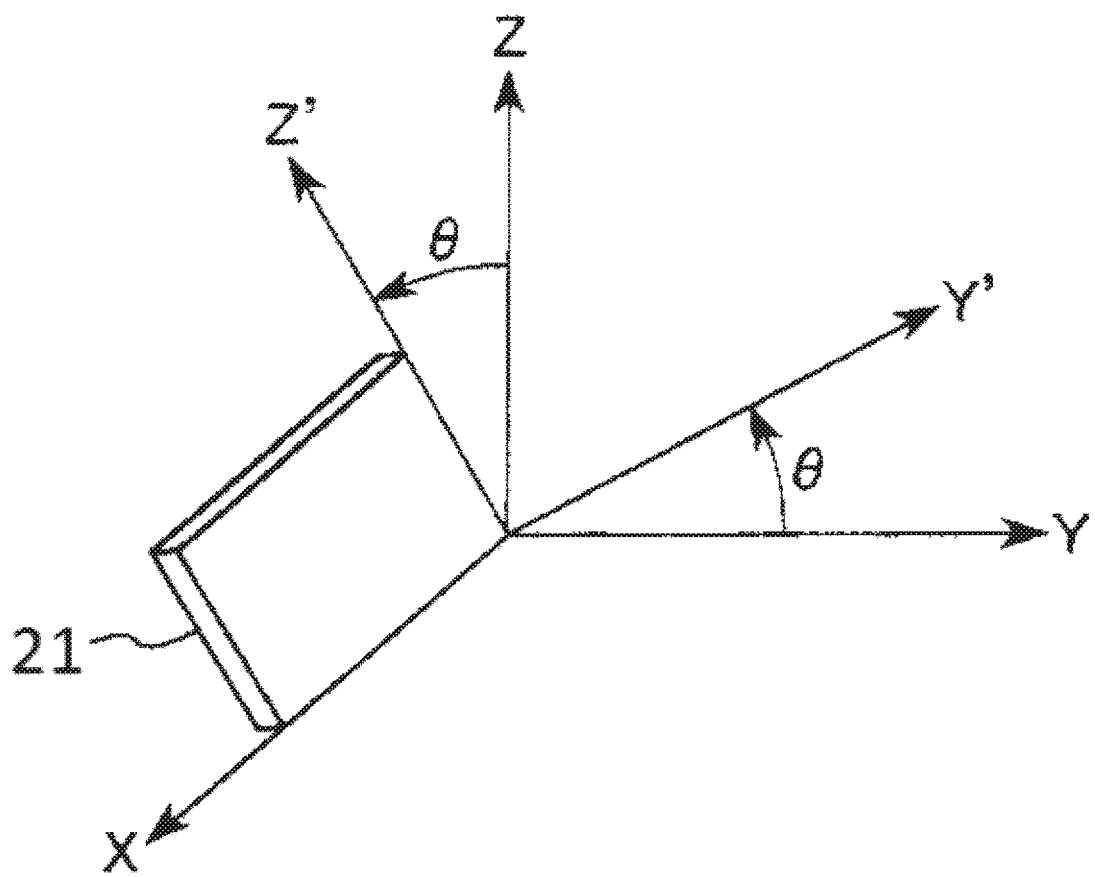
FIG. 7 is a diagram illustrating a cut angle of quartz crystal.
Figure 8:
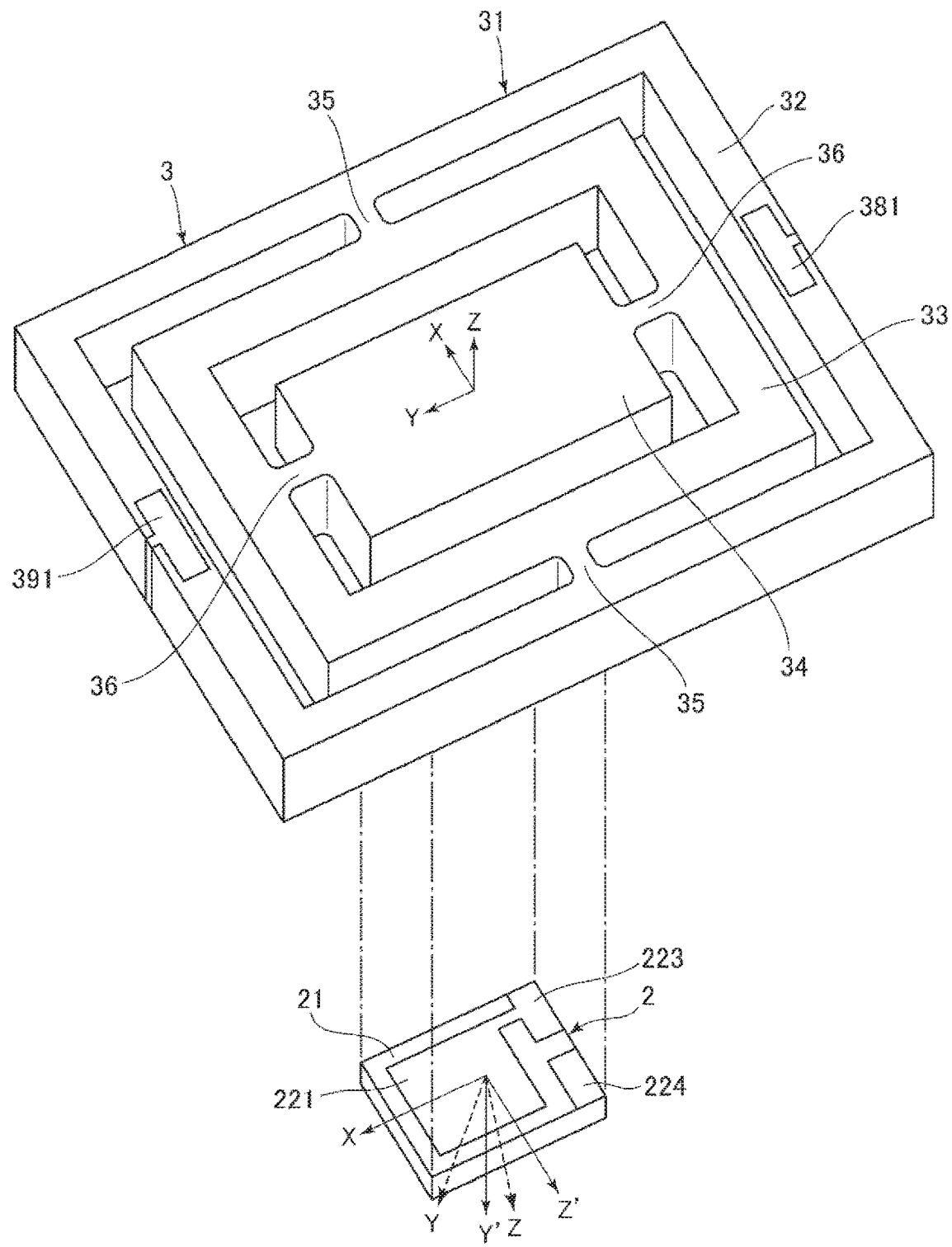
FIG. 8 is a perspective view illustrating a relationship between crystal axes of the relay substrate and the vibrator element.
Figure 9:
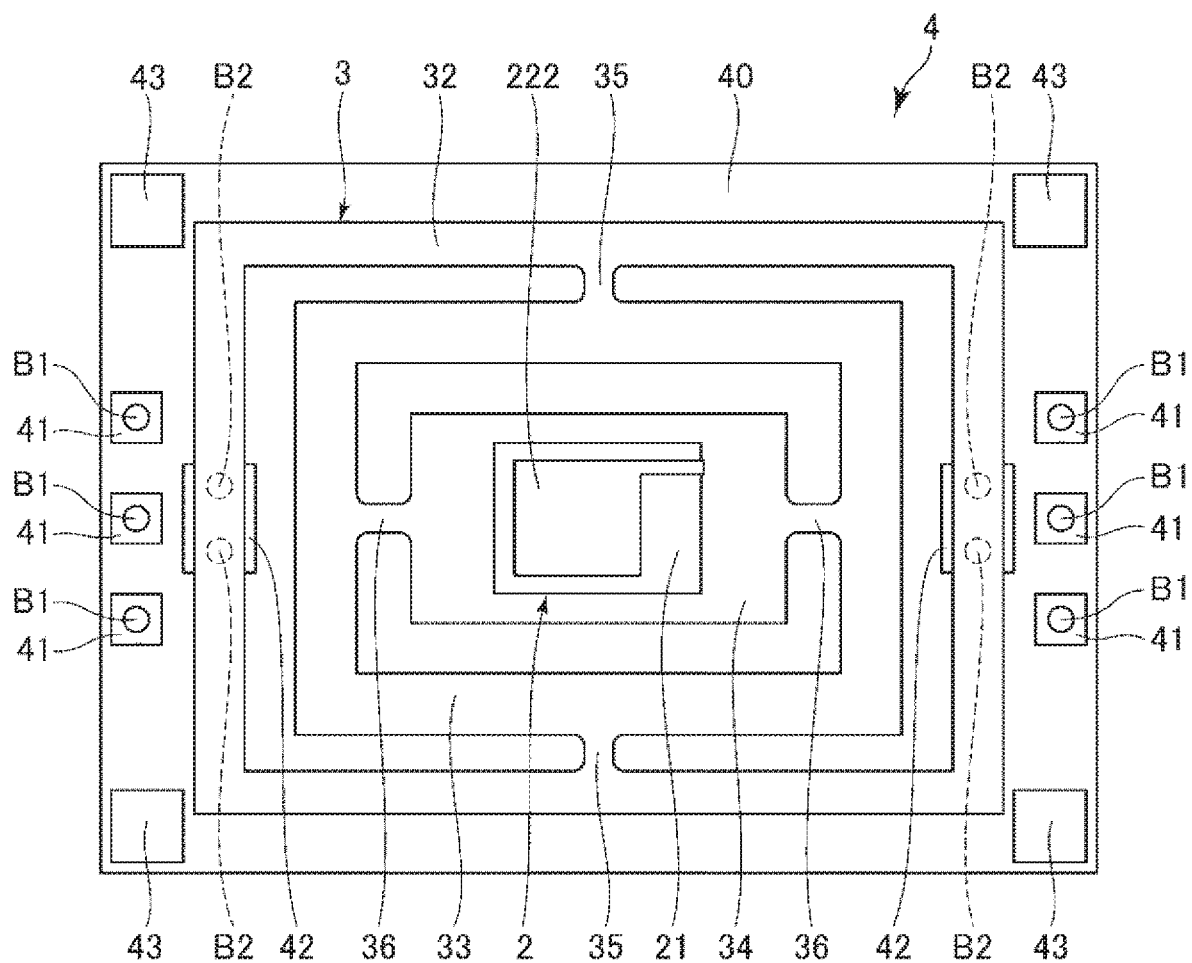
FIG. 9 is a bottom view illustrating a circuit element.
Figure 10:
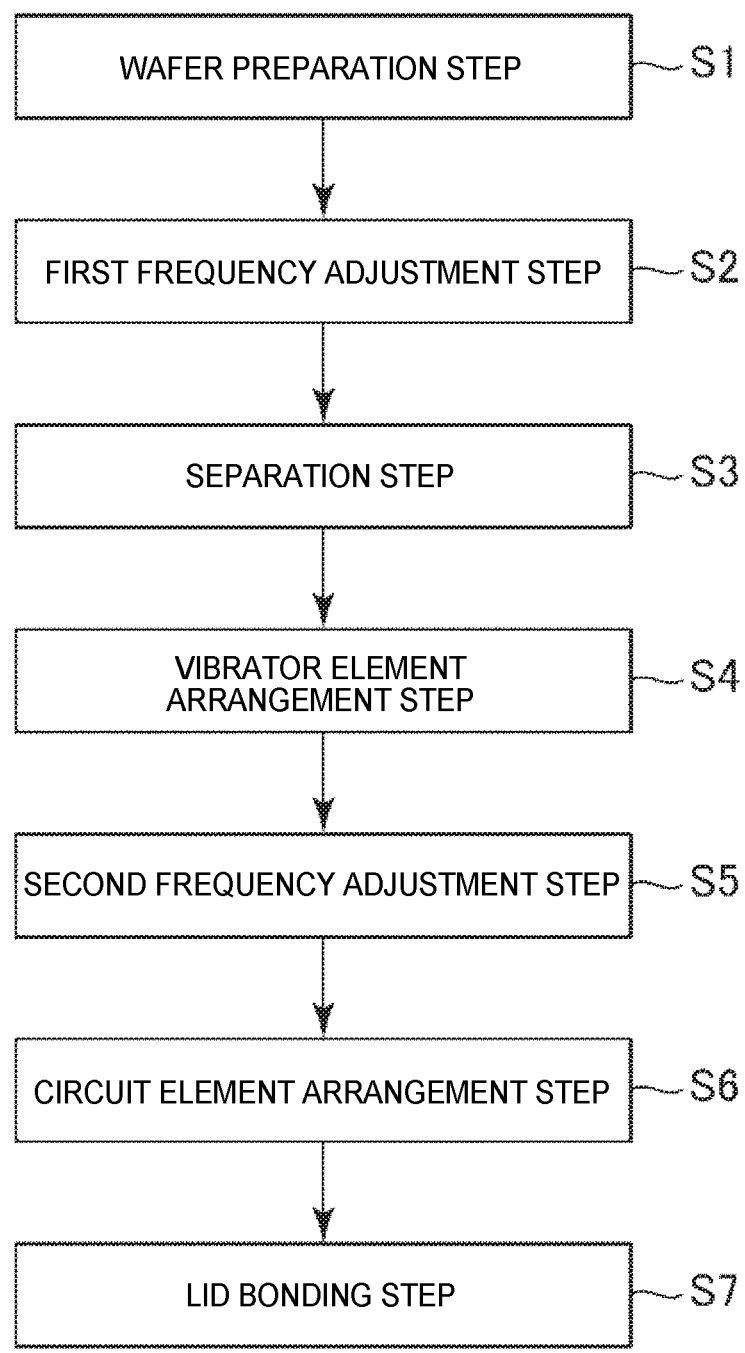
FIG. 10 is a flowchart illustrating a step of manufacturing the vibrator device illustrated in FIG. 1.
Figure 11:
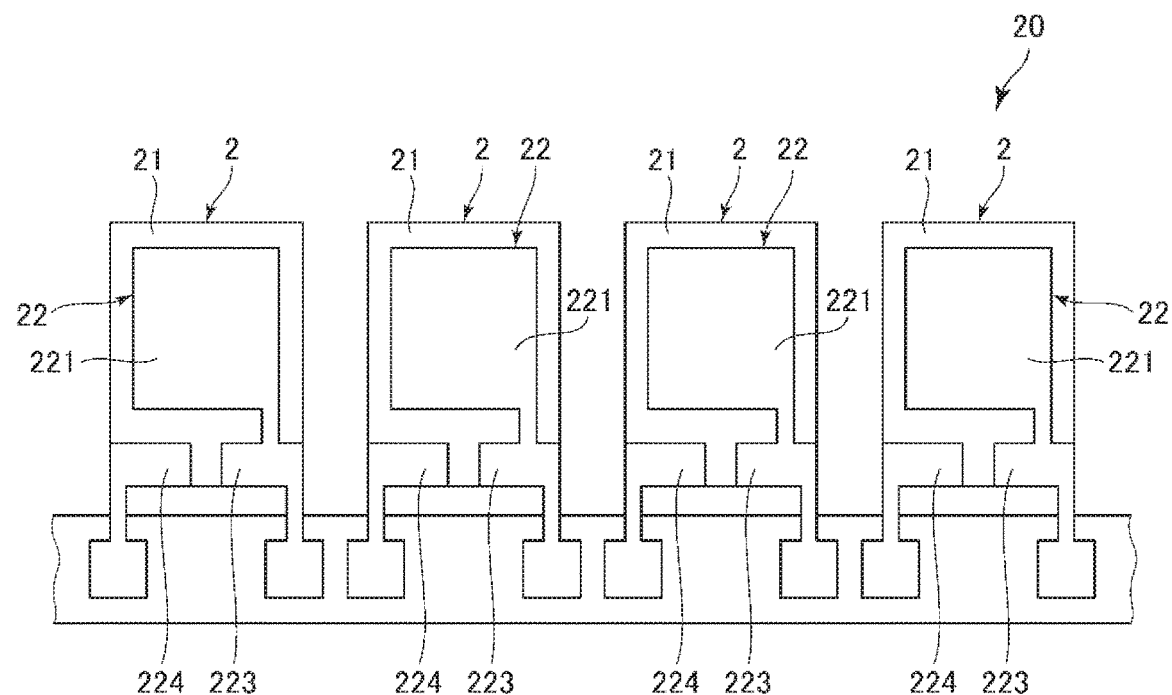
FIG. 11 is a plan view illustrating a method of manufacturing the vibrator device.
Figure 12:
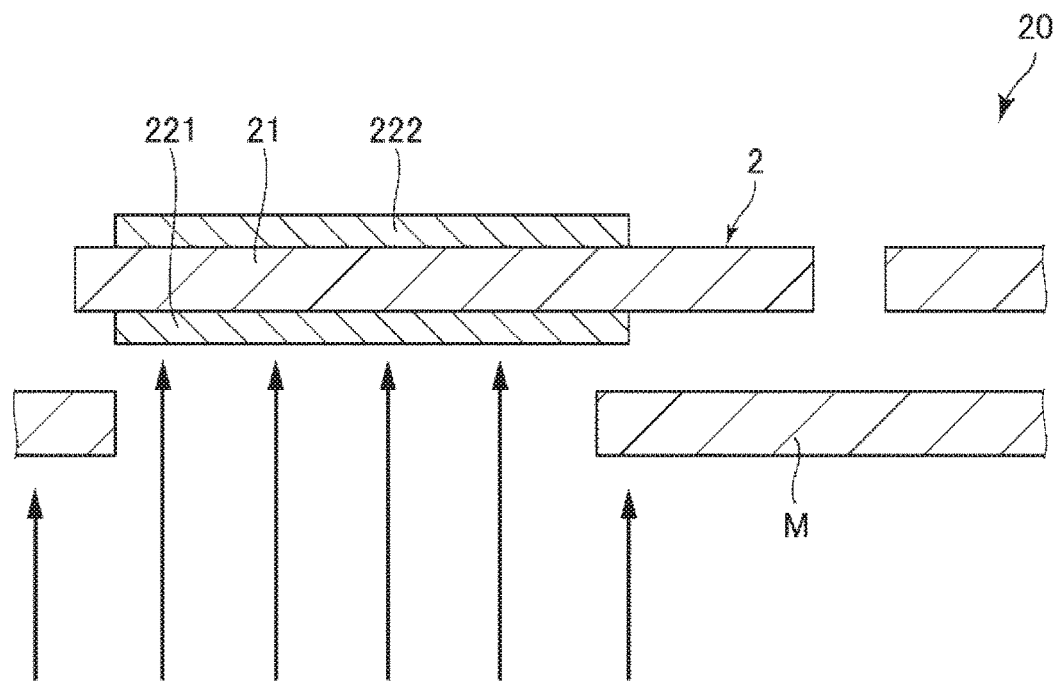
FIG. 12 is a cross-sectional view illustrating a method of manufacturing the vibrator device.
Figure 13:
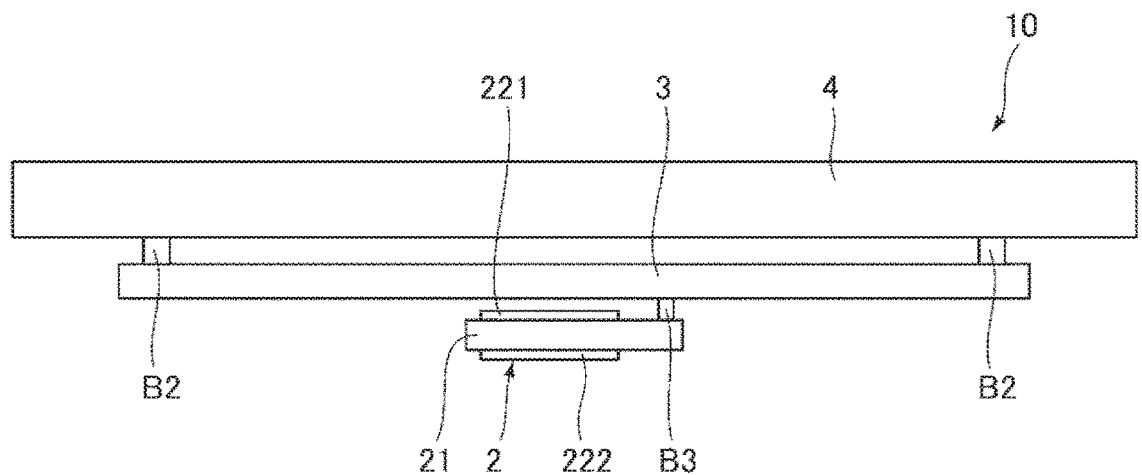
FIG. 13 is a side view illustrating a method of manufacturing the vibrator device.
Figure 14:
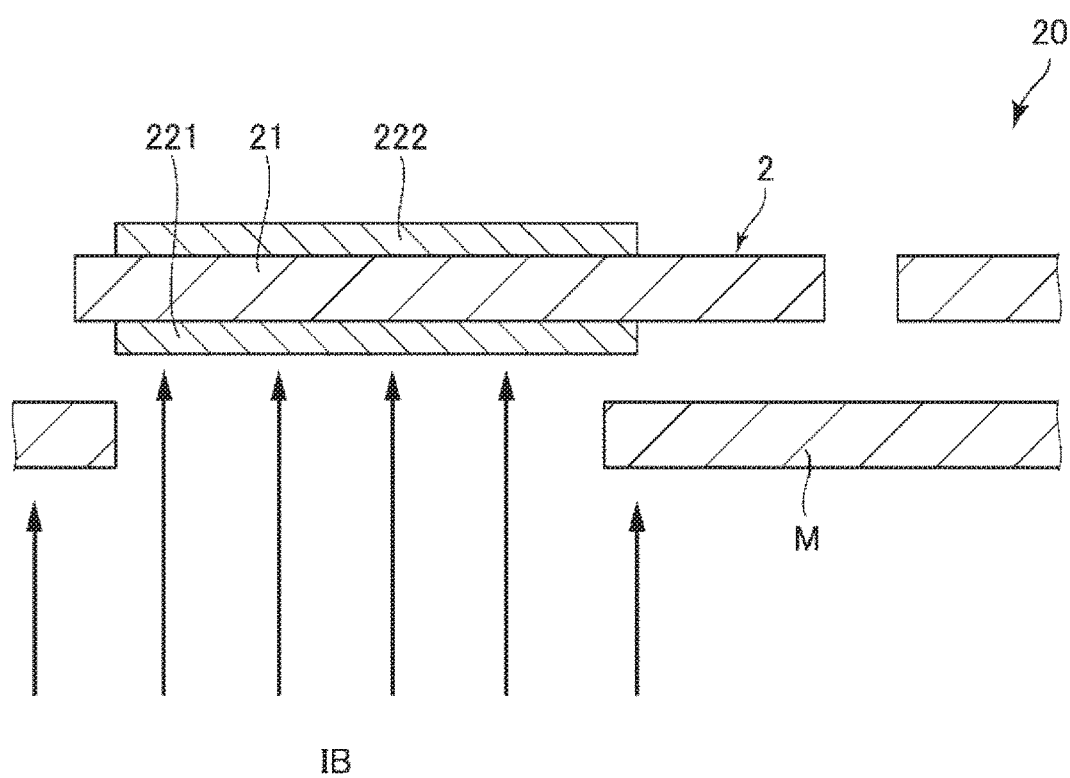
FIG. 14 is a cross-sectional view illustrating a method of manufacturing the vibrator device.
Figure 15:
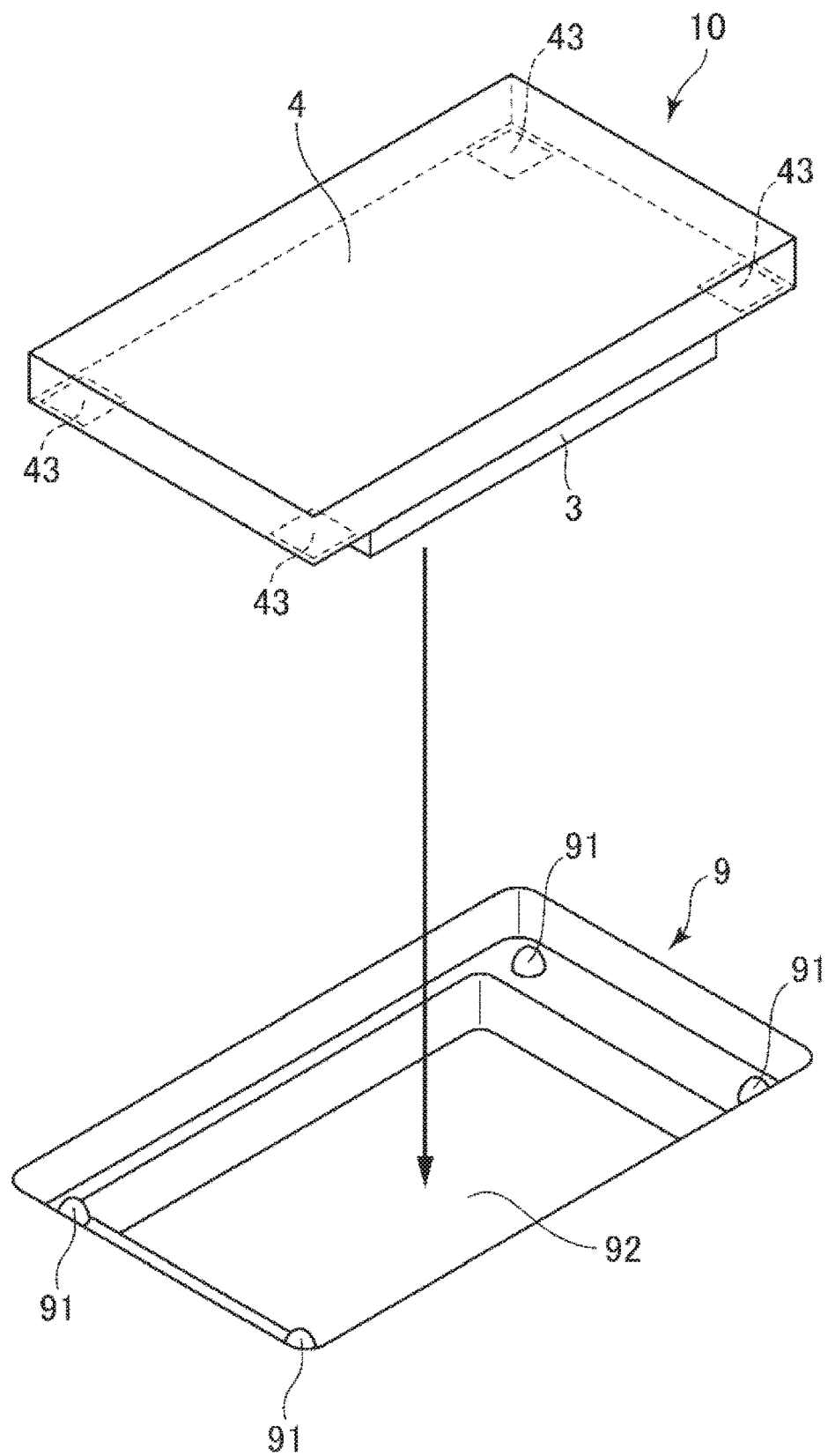
FIG. 15 is a perspective view illustrating a jig used for the manufacture of the vibrator device.
Figure 16:
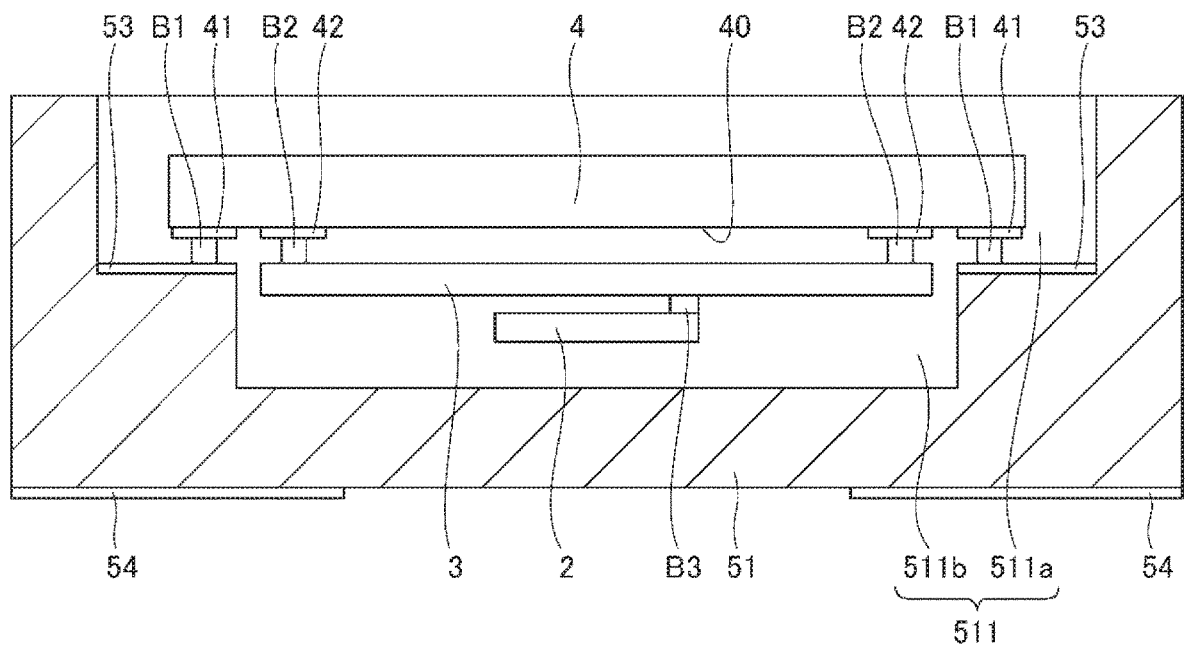
FIG. 16 is a cross-sectional view illustrating a method of manufacturing the vibrator device.
Figure 17:
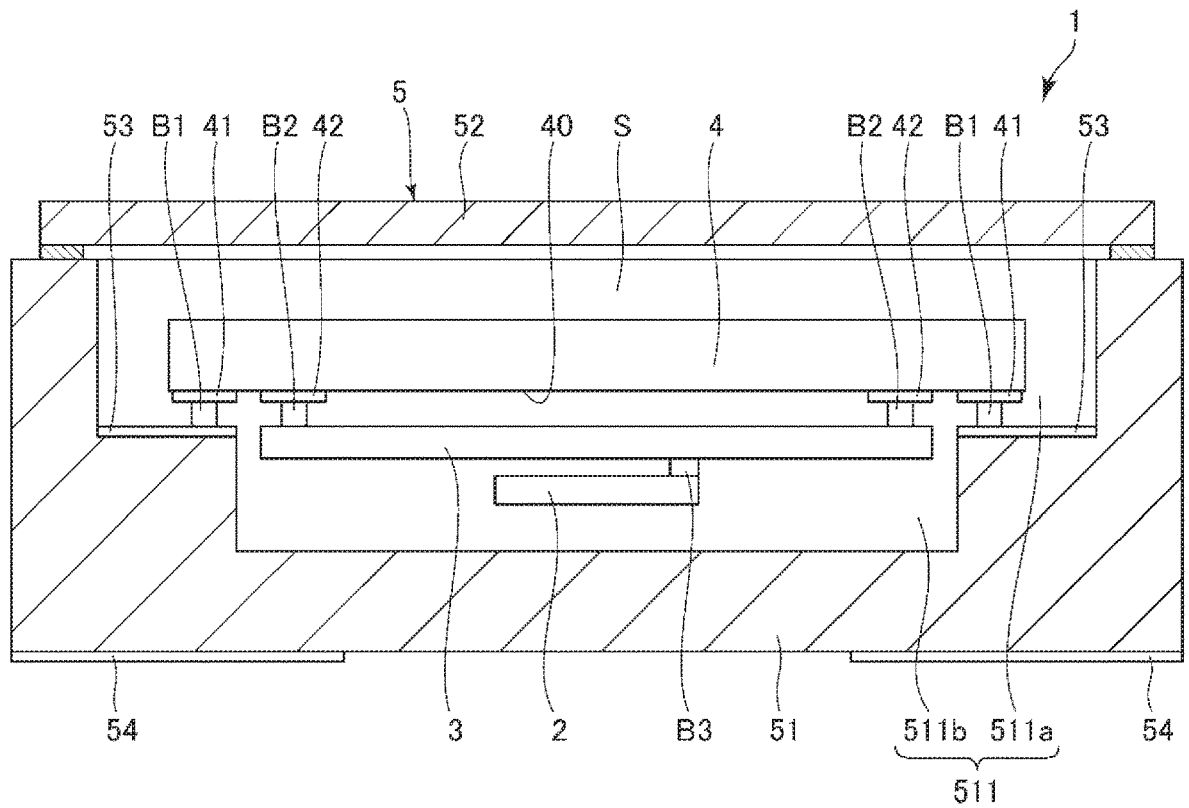
FIG. 17 is a cross-sectional view illustrating a method of manufacturing the vibrator device.

FIG. 1 is a cross-sectional view illustrating a vibrator device according to a first embodiment of the invention. FIG. 2 is a top view illustrating the vibrator device of FIG. 1. FIG. 3 is a top view illustrating a relay substrate. FIG. 4 is a bottom view illustrating the relay substrate. FIG. 5 is a top view illustrating a vibrator element. FIG. 6 is a bottom view illustrating the vibrator element. FIG. 7 is a diagram illustrating a cut angle of quartz crystal. FIG. 8 is a perspective view illustrating a relationship between crystal axes of the relay substrate and the vibrator element. FIG. 9 is a bottom view illustrating a circuit element. FIG. 10 is a flowchart illustrating a step of manufacturing the vibrator device illustrated in FIG. 1. FIG. 11 is a plan view illustrating a method of manufacturing the vibrator device. FIG. 12 is a cross-sectional view illustrating a method of manufacturing the vibrator device. FIG. 13 is a side view illustrating a method of manufacturing the vibrator device. FIG. 14 is a cross-sectional view illustrating a method of manufacturing the vibrator device. FIG. 15 is a perspective view illustrating a jig used for the manufacture of the vibrator device. FIG. 16 is a cross-sectional view illustrating a method of manufacturing the vibrator device. FIG. 17 is a cross-sectional view illustrating a method of manufacturing the vibrator device. Meanwhile, hereinafter, for convenience of description, the upper side in FIG. 1 will also be referred to as "top", and the lower side will also be referred to as "bottom". In addition, a description will be given on the assumption that the crystal axes of quartz crystal are an X-axis (electric axis), a Y-axis (mechanical axis), and a Z-axis (optical axis).

As illustrated in FIGS. 1 and 2, a vibrator device 1 includes a vibrator element 2, a relay substrate 3, a circuit element 4, and a package 5 accommodating these components. In the package 5, the relay substrate 3 is positioned below the circuit element 4, the vibrator element 2 is positioned below the relay substrate 3, and the circuit element 4, the relay substrate 3, and the vibrator element 2 are disposed so as to overlap each other in the thickness direction of the package 5. In this manner, it is possible to suppress planar expansion of the vibrator device 1 and to achieve the miniaturization of the vibrator device 1 by disposing the circuit element 4, the relay substrate 3, and the vibrator element 2 so as to overlap each other. In addition, the vibrator element 2 is attached to the relay substrate 3, the relay substrate 3 is attached to the circuit element 4, and the circuit element 4 is attached to the package 5. In this manner, deformation (stress) due to, for example, thermal deflection of the package 5 is hardly transmitted to the vibrator element 2 by interposing the circuit element 4 and the relay substrate 3 between the package 5 and the vibrator element 2, and thus it is possible to suppress the deterioration of vibration characteristics of the vibrator element 2. Hereinafter, the portions of the vibrator device 1 will be sequentially described in detail.

Package

As illustrated in FIG. 1, the package 5 has a storage space S therein, and the vibrator element 2, the relay substrate 3, and the circuit element 4 are accommodated in the storage space S. For this reason, it is possible to suitably protect the vibrator element 2, the relay substrate 3, and the circuit element 4 by the package 5 from an impact, dust, heat, humidity (moisture), and the like. The package 5 includes a base 51 to which the vibrator element 2, the relay substrate 3, and the circuit element 4 are attached, and a lid 52 which is bonded to the upper surface of the base 51 so as to form the storage space S between the base 51 and the lid 52.

The base 51 has a cavity shape having a concave portion 511 opening on the upper surface thereof. In addition, the concave portion 511 includes a first concave portion 511*a* opening on the upper surface of the base 51, and a second concave portion 511*b* opening on the bottom surface of the first concave portion 511*a*. On the other hand, the lid 52 has a plate shape, and is bonded to the upper surface of the base 51 so as to close the opening of the concave portion 511. In this manner, the storage space S is formed by closing the opening of the concave portion 511 by the lid 52, and the vibrator element 2, the relay substrate 3, and the circuit element 4 are accommodated in the storage space S. The storage space S is airtightly sealed, and is set to be in a reduced pressure state (preferably, a state closer to vacuum). Thereby, it is possible to stably drive the vibrator element 2. However, the atmosphere of the storage space S is not particularly limited, and may be, for example, atmospheric pressure.

A constituent material of the base 51 is not particularly limited, and various ceramics such as an aluminum oxide can be used. In this case, it is possible to manufacture the base 51 by firing a laminated body of a ceramic sheet (green sheet). On the other hand, a constituent material of the lid 52 is not particularly limited, but the lid 52 may be a member having a linear expansion coefficient approximate to that of the constituent material of the base 51. For example, in a case where a constituent material of the base 51 is the above-described ceramics, it is preferable that the lid 52 is formed of an alloy such as Kovar.

In addition, the base 51 includes a plurality of internal terminals 53 disposed on the bottom surface of the first concave portion 511*a*, and a plurality of external terminals 54 disposed on the bottom surface of the base 51. The plurality of internal terminals 53 are electrically connected to the predetermined external terminals 54, respectively, through an internal wiring, not shown in the drawing, which is formed inside the base 51. In addition, the plurality of internal terminals 53 are electrically connected to the circuit element 4 through conductive connection bumps B1.

Circuit Element

The circuit element 4 is, for example, a semiconductor circuit substrate in which various circuit elements are formed on a silicon substrate, and is disposed within the package 5 with an active surface 40 facing downward, as illustrated in FIG. 1. The circuit element 4 is fixed to the upper surface of the first concave portion 511*a* of the package 5 through the conductive connection bump B1. In addition, the circuit element 4 includes a plurality of terminals 41 and 42 disposed on the active surface 40. Among these, the plurality of terminals 41 are electrically connected to the predetermined internal terminals 53 through the connection bumps B1, respectively. The circuit element 4 includes, for example, an oscillation circuit that oscillates the vibrator element 2.

Meanwhile, the connection bump B1 is not particularly limited as long as the connection bump has conductivity and bondability, but it is preferable to use various metal bumps such as a gold bump, a silver bump, and a copper bump. Thereby, an out gas from the connection bump B1 is prevented, and thus it is possible to effectively suppress environmental changes (particularly, an increase in pressure) in the storage space S.

Relay Substrate

As illustrated in FIG. 1, the relay substrate 3 is interposed between the circuit element 4 and the vibrator element 2. The relay substrate 3 mainly has a function of making it difficult for stress caused by the deformation of the package 5 and the circuit element 4 to be transmitted to the vibrator element 2.

As illustrated in FIGS. 3 and 4, the relay substrate 3 includes a substrate 31 and a pair of wirings 38 and 39 disposed on the substrate 31. The substrate 31 has a gimbal shape. Specifically, the substrate 31 includes a frame-shaped supporting portion 32 fixed to the circuit element 4, a frame-shaped first swing portion 33 positioned on the inner side of the supporting portion 32, a second swing portion 34 positioned on the inner side of the first swing portion 33 and having the vibrator element 2 fixed thereto, a pair of beam portions 35 connecting the supporting portion 32 and the first swing portion 33 to each other, and a pair of beam portions 36 connecting the first swing portion 33 and the second swing portion 34 to each other.

The supporting portion 32 has a rectangular frame shape, and includes four edge portions 321, 322, 323, and 324. The supporting portion 32 is fixed to the active surface 40 of the circuit element 4 through two connection bumps B2 at center portions of the edge portions 321 and 322 facing each other (positioned on the opposite sides with respect to a center O) in the extension direction. In this manner, the posture of the relay substrate 3 is stabilized by fixing both sides of the supporting portion 32 to the circuit element 4, and thus it is possible to suppress unnecessary displacement, vibration, and the like of the relay substrate 3. However, the number and arrangement of the connection bumps B2 are not particularly limited, and the connection bumps B2 may be disposed, for example, at the respective corner portions of the supporting portion 32.

Meanwhile, the connection bump B2 is not particularly limited as long as the connection bump has conductivity and bondability, but it is preferable to use various metal bumps such as a gold bump, a silver bump, and a copper bump. Thereby, the out gas from the connection bump B2 is prevented, and thus it is possible to effectively suppress environmental changes (particularly, an increase in pressure) in the storage space S.

In addition, the first swing portion 33 positioned on the inner side of the supporting portion 32 has a rectangular plate shape, and includes four edge portions 331, 332, 333, and 334. In addition, the second swing portion 34 positioned on the inner side of the first swing portion 33 has a rectangular frame shape, and has four edge portions 341, 342, 343, and 344. The vibrator element 2 is fixed to the lower surface of the second swing portion 34 through a conductive connection bump B3.

In addition, the pair of beam portions 35 are positioned on both sides of the first swing portion 33, and connect the first swing portion 33 and the supporting portion 32 to each other so as to support the first swing portion 33 at both sides thereof. Specifically, one beam portion 35 connects the center portions of the edge portions 323 and 333 in the extension direction, and the other beam portion 35 connects the center portions of the edge portions 324 and 334 in the extension direction. For this reason, the first swing portion 33 is swingable around a first axis L1 (a line segment connecting the pair of beam portions 35 to each other) which is formed by the pair of beam portions 35 with respect to the supporting portion 32.

In addition, the pair of beam portions 36 are positioned on both sides of the second swing portion 34, and connect the second swing portion 34 and the first swing portion 33 to each other so as to support the second swing portion 34 at both sides thereof. Specifically, one beam portion 36 connects the center portions of the edge portions 331 and 341 in the extension direction, and the other beam portion 36 connects the center portions of the edge portions 332 and 342 in the extension direction. For this reason, the second swing portion 34 is swingable around a second axis L2 (a line segment connecting the pair of beam portions 36 to each other) which is formed by the pair of beam portions 36 and intersects the first axis L1 with respect to the first swing portion 33.

According to the substrate 31 configured in such a manner, it is possible to meander a transmission path of stress from the supporting portion 32 fixed to the circuit element 4 to the second swing portion 34 to which the vibrator element 2 is fixed, and thus it is possible to secure the transmission path as long as possible. For this reason, stress caused by the deformation of the package 5 and the circuit element 4 is effectively absorbed and alleviated between the supporting portion 32 and the second swing portion 34, and thus it is possible to effectively suppress the transmission of the stress to the vibrator element 2 on the second swing portion 34. For this reason, a change in driving characteristics of the vibrator element 2 (particularly, a fluctuation in a resonance frequency) hardly occurs, and thus the vibrator element 2 can exhibit excellent vibration characteristics.

Particularly, in this embodiment, the first axis L1 and the second axis L2 are perpendicular to each other when viewed in a plan view of the relay substrate 3, and an intersection between the first axis L1 and the second axis L2 is consistent with the center O of the substrate 31. Thereby, the first swing portion 33 is supported by the supporting portion 32 in a well-balanced manner, and the second swing portion 34 is supported by the first swing portion 33 in a well-balanced manner. As a result, it is possible to effectively suppress the swing of the vibrator element 2 fixed to the second swing portion 34.

The substrate 31 is formed by patterning a quartz crystal substrate through etching (particularly, wet etching). In this embodiment, the substrate 31 is constituted by a Z cut quartz crystal substrate, and the normal lines of both principal surfaces of the substrate 31 are consistent with a Z-axis (optical axis) which is a crystal axis of quartz crystal. Since etching for the Z-axis (optical axis) proceeds preferentially as compared to the X-axis (electric axis) and the Y-axis (mechanical axis) which are the other crystal axes of quartz crystal, it is possible to reduce an etching time by constituting the substrate 31 by a Z cut quartz crystal substrate. In addition, an etching surface (a side surface formed by the etching) becomes steeper, and thus it is possible to form the relay substrate 3 with excellent dimensional accuracy.

Meanwhile, the substrate 31 is not particularly limited, and may be constituted by a quartz crystal substrate, for example, an X cut quartz crystal substrate, a Y cut quartz crystal substrate, an AT cut quartz crystal substrate, a BT cut quartz crystal substrate, an SC cut quartz crystal substrate, an ST cut quartz crystal substrate, or the like, other than the Z cut quartz crystal substrate. In addition, the substrate 31 is not limited to a substrate constituted by a quartz crystal substrate, and may be constituted by, for example, a piezoelectric substrate, a silicon substrate, a resin substrate, a metal substrate, a ceramic substrate, or the like other than quartz crystal.

The wiring 38 is wound around the supporting portion 32 and the second swing portion 34, and is configured such that one end thereof serves as a terminal 381 positioned at the supporting portion 32 and the other end serves as a terminal 382 positioned at the second swing portion 34. Similarly, the wiring 39 is wound around the supporting portion 32 and the second swing portion 34, and is configured such that one end thereof serves as a terminal 391 positioned at the supporting portion 32 and the other end serves as a terminal 392 positioned at the second swing portion 34. The terminals 381 and 391 are electrically connected to the terminals 42 of the circuit element 4 through the connection bumps B2, respectively, and the terminals 382 and 392 are electrically connected to the vibrator element 2 through the conductive connection bump B3. In this manner, the relay substrate 3 includes the wirings 38 and 39, so that electrical connection between the vibrator element 2 and the circuit element 4 is facilitated.

Although the relay substrate 3 has been described above, the configuration of the relay substrate 3 is not limited to the above-described configuration. For example, the substrate 31 may be configured such that the first swing portion 33 and the beam portions 35 are omitted and the second swing portion 34 is connected to the supporting portion 32 through the beam portions 36. In addition, the substrate 31 may have a single plate shape instead of a gimbal shape. In addition, each of the supporting portion 32 and the first swing portion has a circular shape, but a portion thereof in the circumferential direction may be lost. In addition, the first and second axes L1 and L2 may not be perpendicular to each other (that is, the axes may intersect each other at an angle other than 90 degrees), and the intersection between the first and second axes L1 and L2 may not be consistent with the center O of the substrate 31. In addition, one of the pair of beam portions 35 may be omitted, or one of the pair of beam portions 36 may be omitted. Further, in this embodiment, the first swing portion 33 is swingable with respect to the supporting portion 32, and the second swing portion 34 is swingable with respect to the first swing portion 33, but the invention is not limited thereto. For example, the beam portion 35 may be hard and the first swing portion 33 may not be substantially swingable with respect to the supporting portion 32, and the beam portion 36 may be hard and the second swing portion 34 may not be substantially swingable with respect to the first swing portion 33.

Vibrator Element

The vibrator element 2 includes a vibration substrate 21 and an electrode 22 disposed on the vibration substrate 21, as illustrated in FIGS. 5 and 6. In addition, the vibration substrate 21 is formed of a piezoelectric material, and is particularly formed of quartz crystal in this embodiment. Thereby, the vibrator element 2 having more excellent frequency-temperature characteristics than other piezoelectric materials is obtained. Meanwhile, the piezoelectric material is not limited to quartz crystal, and may be, for example, lithium niobate ($LiNbO_3$), lithium tantalate ($LiTaO_3$), lead zirconate titanate (PZT), lithium tetraborate ($Li_2B_4O_7$), langasite crystal ($La_3Ga_5SiO_{14}$), potassium niobate ($KNbO_3$), gallium phosphate ($GaPO_4$), Gallium arsenide (GaAs), aluminum nitride (AlN), zinc oxide (ZnO, $Zn_2O_3$), barium titanate ($BaTiO_3$), lead titanate ($PbPO_3$), potassium sodium niobate ((K,Na) $NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or the like.

The vibration substrate 21 has a thickness slip vibration mode, and is constituted by an AT cut quartz crystal substrate in this embodiment. As illustrated in FIG. 7, the AT cut quartz crystal substrate is "a rotated Y cut quartz crystal substrate" which is cut along a plane obtained by rotating an XZ plane around the X-axis at an angle $\theta(=35°\ 15')$. Since the AT cut quartz crystal substrate has a third-order frequency-temperature characteristic, the vibration substrate 21 is constituted by the AT cut quartz crystal substrate, so that the vibrator element 2 having an excellent temperature characteristic is obtained. Meanwhile, hereinafter, the Y-axis and the Z-axis rotated around the X-axis in response to the angle $\theta$ are set to be a Y'-axis and a Z'-axis. That is, the vibration substrate 21 has a thickness in the Y'-axis direction and a width in a direction of an XZ' plane.

The electrode 22 includes an excitation electrode 221 disposed on the upper surface (one principal surface) of the vibration substrate 21, and an excitation electrode 222 disposed on the lower surface (the other principal surface) thereof so as to face the excitation electrode 221. In addition, the electrode 22 includes a pair of terminals 223 and 224 disposed on the upper surface of the vibration substrate 21, a wiring 225 electrically connecting the terminal 223 and the excitation electrode 221, and a wiring 226 electrically connecting the terminal 224 and the excitation electrode 222. Thickness slip vibration of the vibration substrate 21 occurs by applying a driving signal (alternating voltage) between the excitation electrodes 221 and 222.

The vibrator element 2 is fixed to the second swing portion 34 of the relay substrate 3 through the pair of conductive connection bumps B3. In addition, the terminal 223 of the vibrator element 2 and the terminal 382 of the relay substrate 3 are electrically connected to each other through one connection bump B3, and the terminal 224 of the vibrator element 2 and the terminal 392 of the relay substrate 3 are electrically connected to each other through the other connection bump B3. For this reason, the vibrator element 2 is electrically connected to the circuit element 4 through the wirings 38 and 39 of the relay substrate 3.

Although the vibrator element 2 has been described, the configuration of the vibrator element 2 is not limited to the above-described configuration. For example, the vibrator element 2 may have a mesa shape in which a vibration region (a region sandwiched between the excitation electrodes 221 and 222) of the vibration substrate 21 protrudes from the vicinity thereof, and conversely, may have an inverted mesa shape in which the vibration region is recessed from the vicinity thereof. In addition, beveling for grinding the vicinity of the vibration substrate 21 or convex processing for forming the upper surface and the lower surface as curved convex surfaces may be applied. In addition, the vibrator element 2 is not limited to an element that vibrates in a thickness slip vibration mode. For example, the vibrator element 2 may be configured such that flexural vibration (tuning fork vibration) of a plurality of vibrating arms occurs in an in-plane direction or flexural vibration (walk vibration) of a plurality of vibrating arms occurs in an out-of-plane direction.

As described above, both the substrate 31 of the relay substrate 3 and the vibration substrate 21 of the vibrator element 2 are formed of quartz crystal. However, in the vibrator device 1, the crystal axis of the substrate 31 and the crystal axis of the vibration substrate 21 are shifted from each other as illustrated in FIG. 8. That is, the X-axis of the substrate 31 extends in a direction different from that of the X-axis of the vibration substrate 21, the Y-axis of the substrate 31 extends in a direction different from that of the Y-axis of the vibration substrate 21, and the Z-axis of the substrate 31 extends in a direction different from that of the Z-axis of the vibration substrate 21. Thereby, it is possible to separate the mechanical resonance points (resonance frequencies) of the vibration substrate 21 and the substrate 31 from each other, for example, as compared to a case where the crystal axes of the vibration substrate 21 and the substrate 31 are consistent with each other. For this reason, it is possible to suppress the occurrence of unintended vibration on the relay substrate 3 so as to resonate with the vibration of the vibrator element 2, and to effectively suppress the deterioration of vibration characteristics of the vibrator element 2 due to the vibration of the relay substrate 3.

Particularly, in this embodiment, the X-axis of the substrate 31 is inclined around both the Y-axis and the Z-axis with respect to the X-axis of the vibration substrate 21, the Y-axis of the substrate 31 is inclined around both the X-axis and the Z-axis with respect to the Y-axis of the vibration substrate 21, and the Z-axis of the substrate 31 is inclined around both the X-axis and the Y-axis with respect to the Z-axis of the vibration substrate 21. That is, the crystal axis of the substrate 31 and the crystal axis of the vibration substrate are in a twisted relationship. For this reason, the above-described effect becomes more remarkable, and the mechanical resonance points (resonance frequencies) of the vibration substrate 21 and the substrate 31 can be further separated from each other. Therefore, it is possible to more effectively suppress the occurrence of unintended vibration on the relay substrate 3 so as to resonate with the vibration of the vibrator element 2, and to more effectively suppress the deterioration of vibration characteristics of the vibrator element 2 due to the vibration of the relay substrate 3.

Meanwhile, a relationship between the crystal axes of the substrate 31 and the vibration substrate 21 is not particularly limited. For example, when two axes among the X-axis, the Y-axis, and the Z-axis of the substrate 31 are inclined with respect to the corresponding axes of the vibration substrate 21, the remaining one corresponding axes may be consistent with each other. In addition, the X-axis, the Y-axis, and the Z-axis of the substrate 31 may be consistent with the X-axis, the Y-axis, and the Z-axis of the vibration substrate 21, respectively.

Referring back to the circuit element 4, the circuit element 4 includes a plurality of terminals 43 disposed on the active surface 40 as illustrated in FIG. 9. Each of the plurality of terminals 43 functions as a terminal for frequency adjustment which is used for the frequency adjustment of the vibrator element 2. In this manner, the vibrator element 2 can be driven using the terminals 43 (oscillation frequency can be monitored), for example, in a state where the vibrator element 2 is bonded to the circuit element 4 through the relay substrate 3 by disposing the terminals 43 for frequency adjustment on the circuit element 4, and thus it is possible to adjust the frequency of the vibrator element 2 in this state. For this reason, it is possible to terminate the frequency adjustment of the vibrator element 2 before the vibrator element is disposed in the package 5, and thus the package 5 is not wasted even when the frequency of the vibrator element 2 is out of a standard. For this reason, according to the vibrator device 1, it is possible to achieve a reduction in manufacturing costs.

In addition, the plurality of terminals 43 are disposed in a region that does not overlap the vibrator element 2 and the relay substrate 3 on the active surface 40 when viewed in a plan view of the circuit element 4. Thereby, it is easy to press a probe against the terminal 43 from the active surface 40 side when adjusting the frequency of the vibrator element 2. For this reason, it is possible to easily adjust the resonance frequency of the vibrator element 2. Meanwhile, the vibrator element 2 is included in the relay substrate 3 when viewed in a plan view of the circuit element 4, and thus it can be said that the plurality of terminals 43 are disposed in a region that does not overlap the relay substrate 3 on the active surface 40. In particular, the plurality of terminals 43 are positioned on the outer side of the relay substrate 3 (vibrator element 2) when viewed in a plan view. For this reason, it is easier to press a probe against the terminal 43. Meanwhile, in this embodiment, four terminals 43 are disposed at the respective corner portions of the active surface 40, but the number and arrangement of the terminals 43 are not particularly limited.

The vibrator device 1 of this embodiment has been described above. As described above, the vibrator device 1 includes the base 51, the circuit element 4 attached to the base 51, and the vibrator element 2 positioned on the active surface 40 side of the circuit element 4 and attached to the circuit element 4. In addition, the circuit element 4 is disposed in a region not overlapping the vibrator element 2 on the active surface 40 when viewed in a plan view of the active surface 40, and includes the terminals 43 (terminals for frequency adjustment) which are used for the frequency adjustment of the vibrator element 2. According to such a configuration, the oscillation frequency of the vibrator element 2 can be monitored through the terminals 43, and thus it is possible to adjust the frequency of the vibrator element 2 before the vibrator element 2 is accommodated in the package 5. For this reason, at least the package 5 is not wasted even when the frequency of the vibrator element 2 is out of a standard. Therefore, according to the vibrator device 1, it is possible to achieve a reduction in manufacturing costs. In addition, the terminals 41 may not be used during the frequency adjustment of the vibrator element 2 by including the terminals 43. For this reason, the contamination of the terminals 41 is suppressed, and electrical connection between the terminals 41 and the internal terminals 53 can be improved.

In addition, as described above, the terminals 43 are positioned on the outer side of the vibrator element 2 when viewed in a plan view. Thereby, it is easy to press a probe against the terminal 43 when adjusting the frequency of the vibrator element 2.

In addition, as described above, the vibrator device 1 includes the relay substrate 3 positioned between the circuit element 4 and the vibrator element 2. The vibrator element 2 is attached to the circuit element 4 through the relay substrate 3. Thereby, for example, stress caused by the deformation of the package 5 and the circuit element 4 is hardly transmitted to the vibrator element 2. For this reason, the vibrator element 2 can exhibit excellent vibration characteristics.

In addition, as described above, the relay substrate 3 includes the supporting portion 32 (first portion) attached to the base 51, the first swing portion 33 (second portion), the beam portions 35 (first beam portions) connecting the supporting portion 32 and the first swing portion 33 to each other on the first axis L1, the second swing portion 34 (third portion), and the beam portions 36 (second beam portions) connecting the first swing portion 33 and the second swing portion 34 to each other on the second axis L2 intersecting the first axis L1. The vibrator element 2 is supported by the second swing portion 34. Thereby, it is possible to effectively increase a transmission length of stress from the supporting portion 32 to the second swing portion 34, and thus stress caused by the deformation of the package 5 and the circuit element 4 is hardly transmitted to the vibrator element 2.

In addition, as described above, the vibrator device 1 includes the lid 52 (lid body) bonded to the base 51 so as to accommodate the vibrator element 2, the relay substrate 3, and the circuit element 4 between the base 51 and the lid 52. Thereby, it is possible to protect the vibrator element 2, the relay substrate 3, and the circuit element 4 from moisture, dust, an impact, and the like.

Next, a method of manufacturing the above-described vibrator device 1 (a frequency adjustment method of the vibrator element 2) will be described. As illustrated in FIG. 10, the method of manufacturing the vibrator device 1 includes a wafer preparation step S1 of preparing the wafer 20 on which the vibrator element 2 is formed, a first frequency adjustment step S2 of adjusting the frequency of the vibrator element 2 in the state of the wafer 20, a separation step S3 of separating the vibrator element 2 from the wafer 20, a vibrator element arrangement step S4 of disposing the vibrator element 2 on the circuit element 4 through the relay substrate 3, a second frequency adjustment step S5 of adjusting the frequency of the vibrator element 2, a circuit element arrangement step S6 of disposing the circuit element 4 on the base 51, and a lid bonding step S7 of bonding the lid 52 to the base 51. Hereinafter, these steps will be sequentially described.

Wafer Preparation Step S1

First, the wafer 20 having a thin plate shape and constituted by an AT cut quartz crystal plate is prepared, and a plurality of vibration substrates 21 are formed within the wafer 20 by patterning the wafer 20 through etching (dry etching, wet etching, or the like). Next, the electrode 22 is formed on the vibration substrate 21 by forming a metal film on the surface of the vibration substrate 21 and patterning the metal film through etching (dry etching, wet etching, or the like). Thereby, as illustrated in FIG. 11, the wafer 20 having a plurality of vibrator elements 2 formed therein is obtained. Meanwhile, in the state of the wafer 20, the electrode 22 is drawn out from the vibrator element 2 to a frame portion supporting the vibrator element 2 and a probe (electrode pin) is pressed against the portion, so that thus it is possible to drive the vibrator element 2 on the wafer 20.

First Frequency Adjustment Step S2

Next, the frequency of the vibrator elements 2 is adjusted on the wafer 20. Specifically, as illustrated in FIG. 12, the frequency of the vibrator element 2 is adjusted by irradiating the excitation electrode 221 with an ion beam IB through a mask M and removing a portion of the excitation electrode 221 (reducing a film thickness). It is preferable that the irradiation with the ion beam IB is performed while applying a driving signal to the vibrator element 2 through a probe to drive the vibrator element 2 and measuring the resonance frequency of the vibrator element 2. Thereby, the resonance frequency of the vibrator element 2 is easily adjusted to a predetermined value. Meanwhile, a method of measuring the resonance frequency of the vibrator element 2 is not particularly limited. However, for example, it is possible to measure the resonance frequency of the vibrator element 2 by measuring the amplitude of the vibrator element 2 using a frequency LDV (laser Doppler velocity meter) while changing the frequency of a driving signal to be applied to the vibrator element 2 by an FFT analyzer.

The amount of frequency adjustment of the vibrator element 2 by this step is not particularly limited. However, for example, in a case where a difference between the resonance frequency of the vibrator element 2 before the adjustment and a target resonance frequency is $\Delta f$ [Hz], the amount is preferably equal to or greater than 0.25 $\Delta f$ and equal to or less than 0.75 $\Delta f$, more preferably equal to or greater than 0.4 $\Delta f$ and equal to or less than 0.6 $\Delta f$, and further preferably 0.5 $\Delta f$. Thereby, in this step, it is possible to sufficiently adjust the frequency of the vibrator element 2. In addition, excessive frequency adjustment in this step is prevented, and it is possible to more reliably adjust the frequency of the vibrator element 2 to a target frequency in the second frequency adjustment step S5 to be performed later.

Meanwhile, in this embodiment, the frequency of the vibrator element 2 is adjusted by irradiating the excitation electrode 221 with the ion beam IB to remove a portion of the excitation electrode 221. However, the invention is not limited thereto, and the frequency of the vibrator element 2 may be adjusted by irradiating the excitation electrode 222 with the ion beam IB to remove a portion of the excitation electrode 222, or may be adjusted by irradiating both the excitation electrodes 221 and 222 with the ion beam IB to remove portions of the excitation electrodes 221 and 222. Further, in this embodiment, the excitation electrode 221 is irradiated with the ion beam IB while measuring the resonance frequency of the vibrator element 2, but the invention is not limited thereto. For example, a step of measuring the resonance frequency of the vibrator element 2 and a step of irradiating the excitation electrode 221 with the ion beam IB may be alternately repeated.

Separation Step S3

Next, the vibrator element 2 is separated from the wafer 20 by being broken off from the wafer 20. However, a method of separating the vibrator element 2 from the wafer 20 is not particularly limited. For example, the vibrator element 2 may be cut off.

Vibrator Element Arrangement Step S4

Next, as illustrated in FIG. 13, the vibrator element 2 is fixed to the relay substrate 3 through the connection bump B3, and the relay substrate 3 is fixed to the circuit element 4 through the connection bumps B2. Thereby, a laminated body 10 of the circuit element 4, the relay substrate 3, and the vibrator element 2 is obtained. Meanwhile, the vibrator element 2 is fixed to the relay substrate 3 so that the excitation electrode 221 faces the circuit element 4 side. Thereby, the excitation electrode 222 can be irradiated with the ion beam IB in the second frequency adjustment step S5 to be described later, and thus it is possible to process the excitation electrodes 221 and 222 in a well-balanced manner by the first and second frequency adjustment steps S2 and S5.

Second Frequency Adjustment Step S5

Next, the frequency of the vibrator element 2 is adjusted in the state of the laminated body 10. Meanwhile, for example, the frequency of the vibrator element 2 is not adjusted to a predetermined value in the first frequency adjustment step S2 because the frequency of the vibrator element 2 may change by fixing the vibrator element 2 to the relay substrate 3, and it is possible to adjust the frequency of the vibrator element 2 with a higher level of accuracy by performing this step.

In this step, as illustrated in FIG. 14, the frequency of the vibrator element 2 is adjusted by irradiating the excitation electrode 222 with the ion beam IB through the mask M and removing a portion of the excitation electrode 222 (reducing a film thickness). In addition, for example, this step is performed in a state where the laminated body 10 is mounted on a jig 9 as illustrated in FIG. 15. The jig 9 includes probes 91, and the probe 91 comes into contact with each of the terminals 43 of the circuit element 4 when the laminated body 10 is mounted on the jig 9. In addition, the jig 9 includes an opening 92 for avoiding contacts with the relay substrate 3 and the vibrator element 2. According to the jig 9, it is possible to apply a driving signal to the vibrator element 2 through the probe 91. Meanwhile, as described above, the terminals 43 are disposed in a region not overlapping the vibrator element 2 and the relay substrate 3 of the active surface 40, which leads to a structure in which the probe 91 easily comes into contact with the terminal 43.

It is preferable that the irradiation with the ion beam IB is performed while applying a driving signal to the vibrator element 2 through the probe 91 to drive the vibrator element 2 and detecting the resonance frequency of the vibrator element 2. Thereby, the resonance frequency of the vibrator element 2 is easily adjusted to a predetermined value. Meanwhile, a method of detecting the resonance frequency of the vibrator element 2 is not particularly limited. However, for example, it is possible to use the same method as in the first frequency adjustment step S2 described above.

Here, since the frequency of the vibrator element 2 is adjusted to a certain degree in the first frequency adjustment step S2, the amount of frequency adjustment in this step is reduced, and an attack on the circuit element 4 by the ion beam IB is reduced accordingly. For this reason, it is possible to reduce damage to the circuit element 4 and to effectively suppress a breakdown (trouble) of the circuit element 4. Particularly, in this embodiment, the relay substrate 3 is disposed between the circuit element 4 and the vibrator element 2, and the relay substrate 3 is formed larger than the vibrator element 2 and includes the vibrator element 2 when viewed in a plan view. For this reason, it is possible to shield the ion beam IB by the relay substrate 3 and to further reduce damage on the circuit element 4 by the ion beam IB.

Further, the excitation electrode 221 is processed in the first frequency adjustment step S2, and the excitation electrode 222 is processed in the second frequency adjustment step S5. Thereby, it is possible to process the excitation electrodes 221 and 222 in a well-balanced manner and to reduce a difference in mass between the excitation electrodes 221 and 222. For this reason, the vibrator element 2 capable of being stably driven is obtained. Particularly, frequency adjustment of approximately 0.5 $\Delta f$ is performed in the first frequency adjustment step S2, and frequency adjustment of approximately the remaining 0.5 $\Delta f$ is performed in the second frequency adjustment step, thereby further reducing a difference in mass between the excitation electrodes 221 and 222.

Meanwhile, in this embodiment, the frequency of the vibrator element 2 is adjusted by irradiating the excitation electrode 222 with the ion beam IB and removing a portion of the excitation electrode 222. However, the invention is not limited thereto, and the frequency of the vibrator element 2 may be adjusted by irradiating the excitation electrode 221 with the ion beam IB and removing a portion of the excitation electrode 221. In this case, in the vibrator element arrangement step S4, the vibrator element 2 may be fixed to the relay substrate 3 so that the excitation electrode 222 faces the circuit element 4 side. Further, in this embodiment, the excitation electrode 222 may be irradiated with the ion beam IB while measuring the resonance frequency of the vibrator element 2, but the invention is not limited thereto. For example, a step of measuring the resonance frequency of the vibrator element 2 and a step of irradiating the excitation electrode 222 with the ion beam IB may be alternately repeated.

Circuit Element Arrangement Step S6

Next, as illustrated in FIG. 16, the circuit element 4 is fixed to the base 51 through the connection bumps B1. Meanwhile, as described above, the vibrator element 2 is fixed to the circuit element 4 through the relay substrate 3, and thus stress from the base 51 and the circuit element 4 is hardly applied to the vibrator element 2. For this reason, the frequency of the vibrator element 2 hardly changes by fixing the circuit element 4 to the base 51 (the amount of change is extremely small even when the frequency changes), and thus it is not necessary to further adjust the frequency of the vibrator element 2 after the circuit element 4 is fixed to the base 51. Therefore, the adjustment of the frequency of the vibrator element 2 can be terminated before the vibrator element 2 is fixed to the base 51, and the vibrator element 2 can be discarded at the stage of the laminated body 10 even when the frequency of the vibrator element 2 is out of a standard, thereby at least preventing the base 51 from being wasted. Therefore, according to such a manufacturing method, it is possible to achieve a reduction in manufacturing costs of the vibrator device 1.

Lid Bonding Step S7

Next, as illustrated in FIG. 17, the lid 52 is bonded to the base 51. Thereby, the package 5 accommodating the laminated body 10 is formed, and thus the vibrator device 1 is obtained.

The method of manufacturing the vibrator device 1 has been described above. As described above, such a method of manufacturing the vibrator device 1 includes the vibrator element arrangement step S4 of preparing the circuit element in which the terminals 43 (terminals for frequency adjustment) used for the adjustment of the frequency of the vibrator element 2 are disposed on the active surface 40, and disposing the vibrator element 2 on the active surface 40 so as not to overlap the terminals 43 when viewed in a plan view of the active surface 40, and the second frequency adjustment step S5 of processing the excitation electrode 222 included in the vibrator element 2 to adjust the frequency of the vibrator element 2. According to such a method, the adjustment of the frequency of the vibrator element 2 can be terminated before the vibrator element 2 is fixed to the base 51, and the vibrator element 2 can be discarded before the vibrator element 2 fixed to the base 51 even when the frequency of the vibrator element 2 is out of a standard, thereby at least preventing the base 51 from being wasted. Therefore, according to such a manufacturing method, it is possible to achieve a reduction in manufacturing costs of the vibrator device 1. In addition, the terminals 43 are provided, and thus the terminals 41 may not be used in the second frequency adjustment step S5. For this reason, the contamination of the terminals 41 is suppressed, and it is possible to electrically connect the terminals 41 and the internal terminals 53 more reliably and with low resistance in the circuit element arrangement step S6.

In addition, as described above, the method of manufacturing the vibrator device 1 includes the wafer preparation step S1 of preparing the wafer 20 (substrate) on which the vibrator element 2 is formed, prior to the vibrator element arrangement step S4 of disposing the vibrator element 2 on the circuit element 4, the first frequency adjustment step S2 of processing the excitation electrode 221 to adjust the frequency of the vibrator element 2, and the separation step S3 of separating the vibrator element 2 from the wafer 20. Thereby, the amount of frequency adjustment in the second frequency adjustment step S5 is reduced, and an attack on the relay substrate 3 and the circuit element 4 by the ion beam IB is reduced accordingly. For this reason, it is possible to reduce damage on the relay substrate 3 and the circuit element 4 which is caused in the second frequency adjustment step S5, and to effectively suppress a breakdown (trouble) of the relay substrate 3 and the circuit element 4.

In addition, as described above, the vibrator element 2 includes the vibration substrate 21, the excitation electrode 221 (first excitation electrode) disposed on one principal surface of the vibration substrate 21, and the excitation electrode 222 (second excitation electrode) disposed on the other principal surface thereof. The excitation electrode 221 is processed in the first frequency adjustment step S2 of adjusting the frequency of the vibrator element 2 in a state where the vibrator element 2 is disposed in the wafer 20, and the excitation electrode 222 is processed in the second frequency adjustment step S5 of adjusting the frequency of the vibrator element 2 in a state where the vibrator element 2 is disposed on the circuit element 4. Thereby, it is possible to process the excitation electrodes 221 and 222 in a well-balanced manner and to reduce a difference in mass between the excitation electrodes 221 and 222. For this reason, the vibrator element 2 capable of being stably driven is obtained.

In addition, as described above, in the vibrator element arrangement step S4 of disposing the vibrator element 2 on the circuit element 4, the relay substrate 3 is prepared, and the vibrator element 2 is disposed on the circuit element 4 through the relay substrate 3. Thereby, stress caused by the deformation of the base 51 and the circuit element 4, or the like is hardly transmitted to the vibrator element 2, and thus the vibrator device 1 having excellent vibration characteristics is obtained. In addition, it is possible to suppress a change in the frequency of the vibrator element 2 after the vibrator element 2 is fixed to the base 51, and thus the vibrator device 1 having a desired frequency is obtained.

In addition, as described above, the method of manufacturing the vibrator device 1 includes the circuit element arrangement step S6 of disposing the circuit element 4 on the base 51 which is performed after the second frequency adjustment step S5 of adjusting the frequency of the vibrator element 2 in a state where the vibrator element 2 is disposed on the circuit element 4 is performed, and the lid bonding step S7 of bonding the lid 52 (lid body) to the base 51 so as to accommodate the circuit element 4, the relay substrate 3, and the vibrator element 2 between the base 51 and the lid 52. Thereby, it is possible to protect the circuit element 4, the relay substrate 3, and the vibrator element 2 from moisture, dust, an impact, and the like.

Second Embodiment

Figure 18:
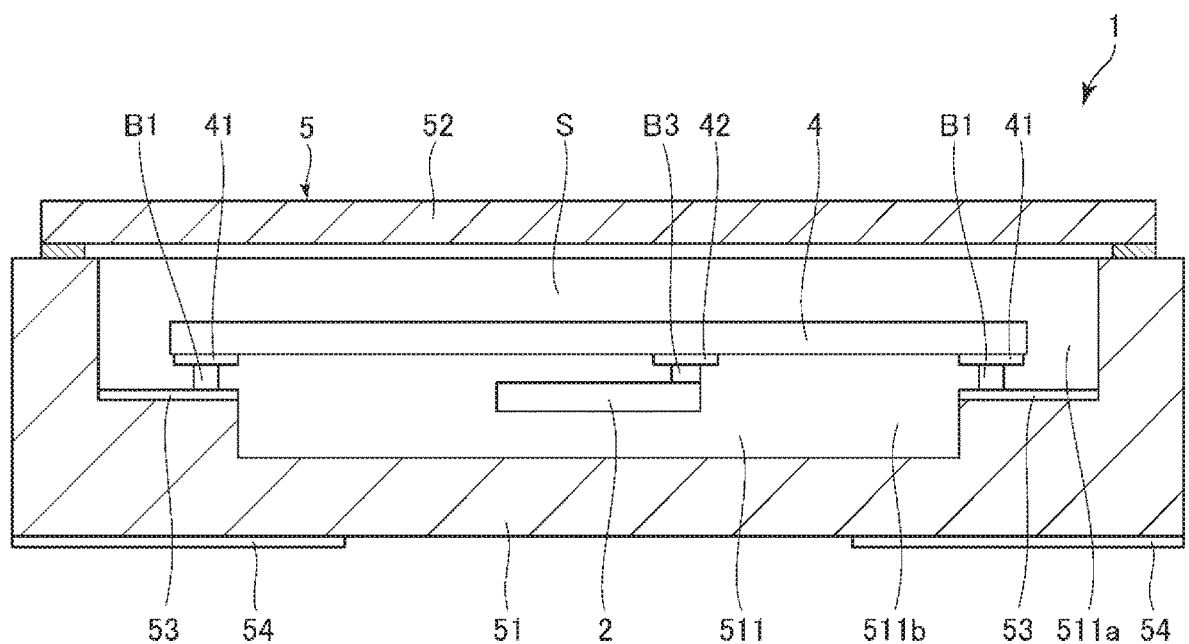
FIG. 18 is a cross-sectional view illustrating a vibrator device according to a second embodiment of the invention.

FIG. 18 is a cross-sectional view illustrating a vibrator device according to a second embodiment of the invention.

The vibrator device according to this embodiment is mainly the same as the vibrator device of the above-described first embodiment except that the relay substrate 3 is omitted. Meanwhile, in the following description, regarding the vibrator device of the second embodiment, differences from the above-described first embodiment will be mainly described, and the same matters will not be described. Further, in FIG. 18, the same components as those in the above-described embodiment will be denoted by the same reference numerals and signs.

As illustrated in FIG. 18, in a vibrator device 1 of this embodiment, a relay substrate 3 is omitted from the above-described first embodiment, and a vibrator element 2 is fixed to an active surface 40 of a circuit element 4 through a connection bump B3. In addition, an electrode 22 is electrically connected to a terminal 42 through the connection bump B3.

Third Embodiment

Next, an electronic apparatus according to a third embodiment of the invention will be described.

Figure 19:
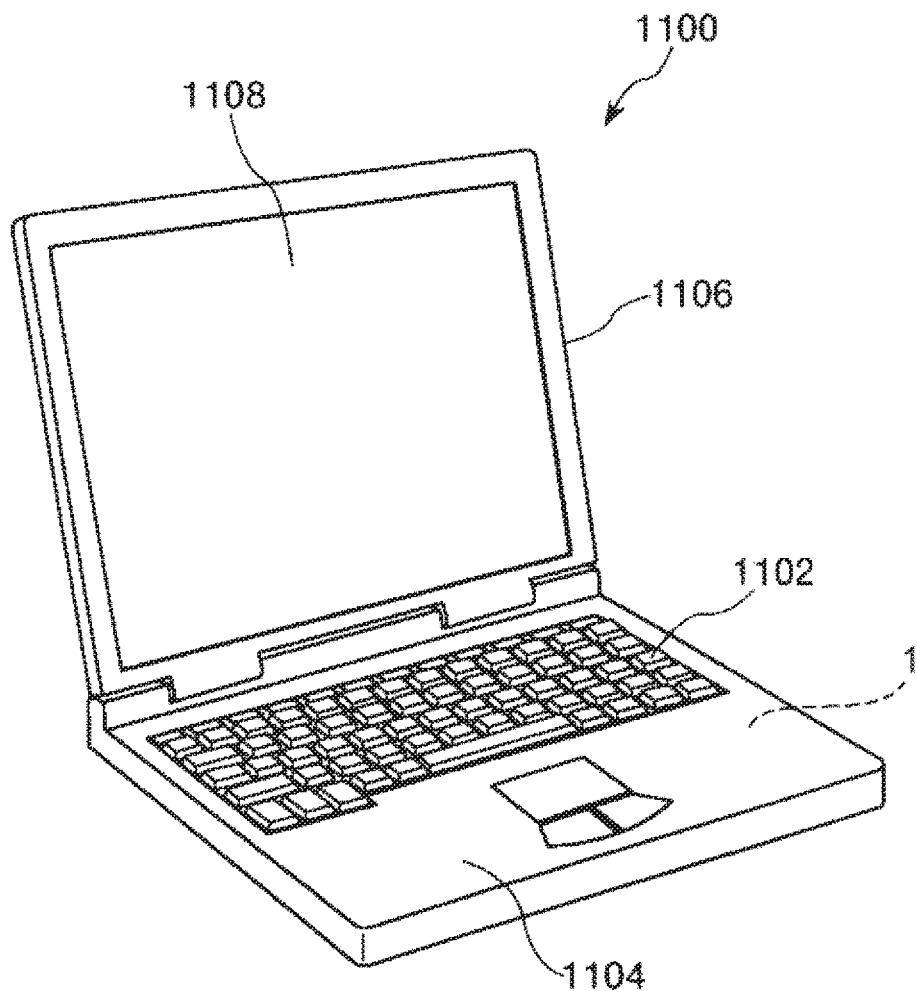
FIG. 19 is a perspective view illustrating an electronic apparatus according to a third embodiment of the invention.

FIG. 19 is a perspective view illustrating the electronic apparatus according to the third embodiment of the invention.

A mobile-type (or note-type) personal computer 1100 illustrated in FIG. 19 is a personal computer to which an electronic apparatus including the vibrator device according to the invention is applied. In this drawing, the personal computer 1100 includes a main body 1104 including a keyboard 1102 and a display unit 1106 including a display portion 1108, and the display unit 1106 is rotatably attached to the main body 1104 through a hinge structure portion. The vibrator device 1 used as, for example, an oscillator is embedded in the personal computer 1100.

The personal computer 1100 (electronic apparatus) includes the vibrator device 1. For this reason, it is possible to enjoy the effect of the above-described vibrator device 1 and to exhibit high reliability.

Fourth Embodiment

Next, an electronic apparatus according to a fourth embodiment of the invention will be described.

Figure 20:
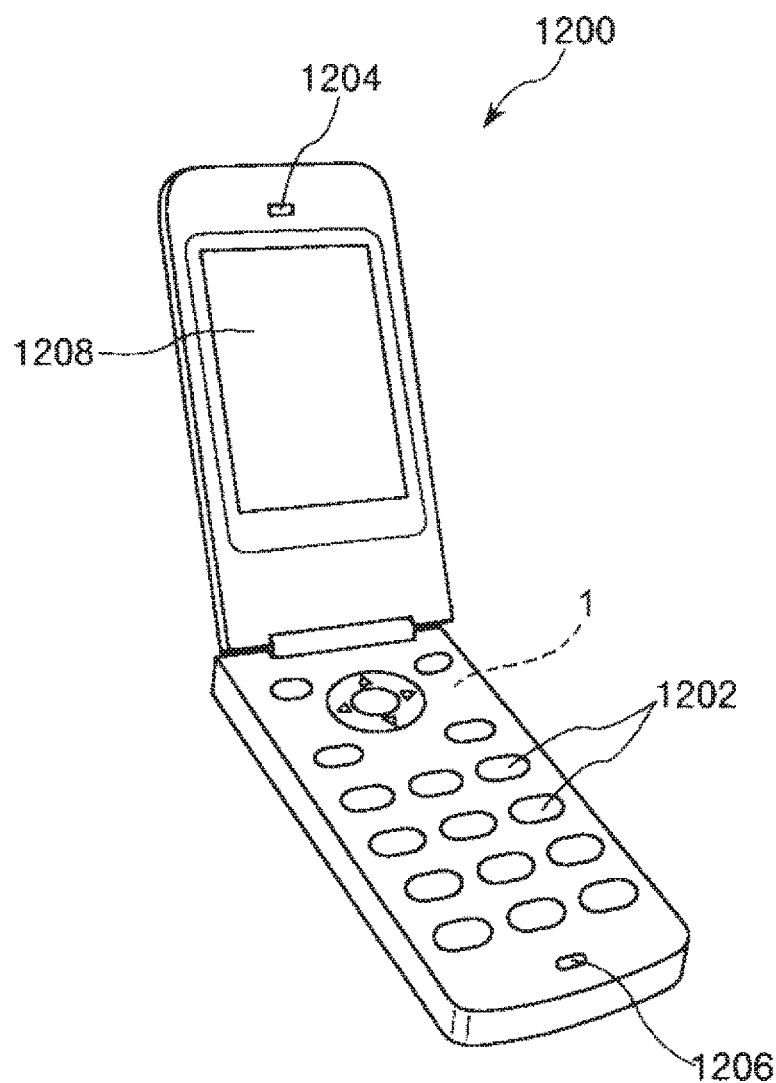
FIG. 20 is a perspective view illustrating an electronic apparatus according to a fourth embodiment of the invention.

FIG. 20 is a perspective view illustrating the electronic apparatus according to the fourth embodiment of the invention.

A mobile phone 1200 (a PHS is also included) illustrated in FIG. 20 is a mobile phone to which an electronic apparatus including the vibrator device according to the invention is applied. The mobile phone 1200 includes an antenna (not shown), a plurality of operation buttons 1202, an earpiece 1204, and a mouthpiece 1206, and a display portion 1208 is disposed between the operation buttons 1202 and the earpiece 1204. The vibrator device 1 used as, for example, an oscillator is embedded in the mobile phone 1200.

The mobile phone 1200 (electronic apparatus) includes the vibrator device 1. For this reason, it is possible to enjoy the effect of the above-described vibrator device 1 and to exhibit high reliability.

Fifth Embodiment

Next, an electronic apparatus according to a fifth embodiment of the invention will be described.

Figure 21:
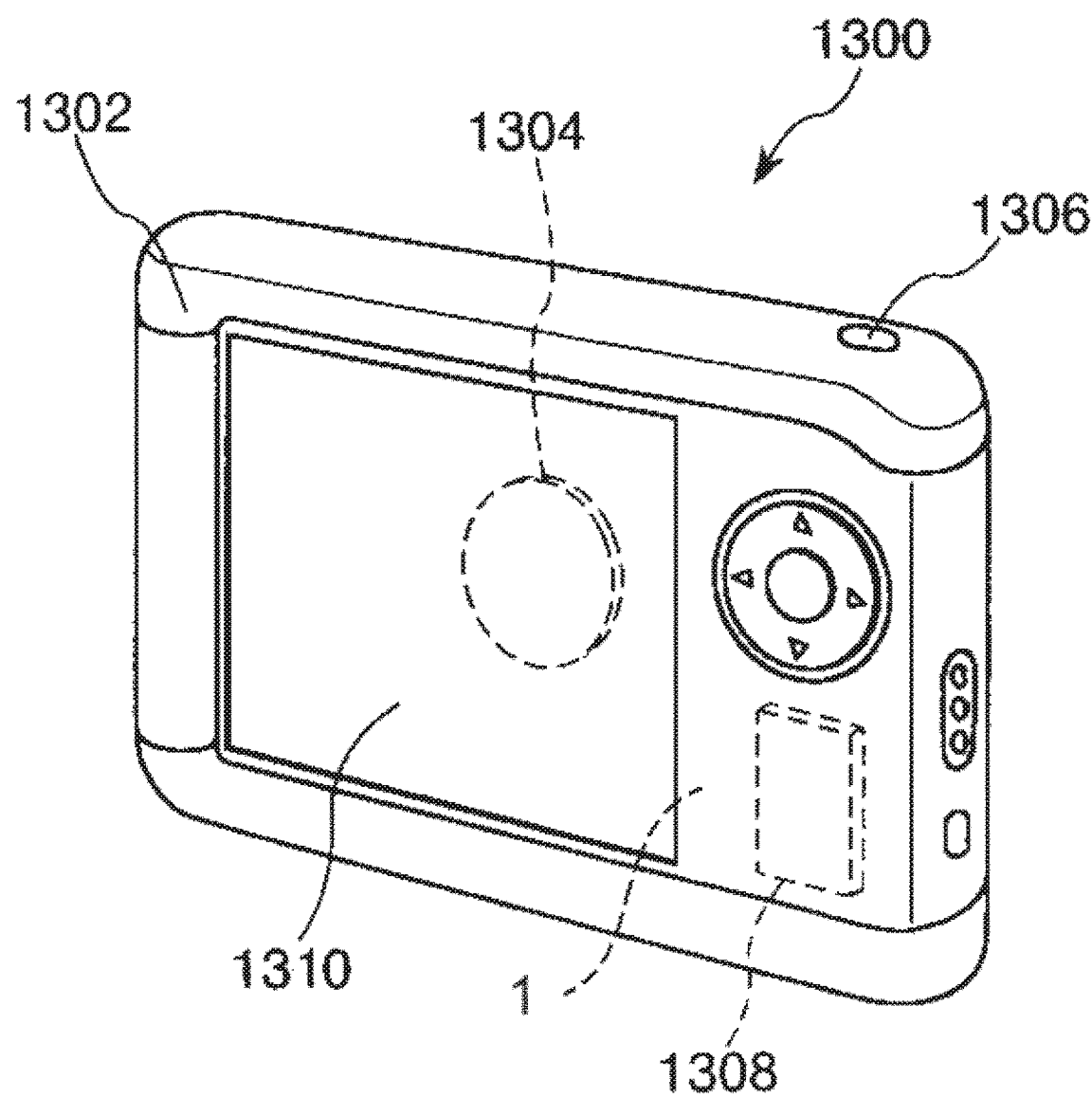
FIG. 21 is a perspective view illustrating an electronic apparatus according to a fifth embodiment of the invention.

FIG. 21 is a perspective view illustrating the electronic apparatus according to the fifth embodiment of the invention.

A digital steel camera 1300 illustrated in FIG. 21 is a camera to which an electronic apparatus including the vibrator device according to the invention is applied. The digital steel camera is configured such that a display portion 1310 is provided on the rear surface of a case (body) 1302 and display is performed on the basis of an imaging signal obtained by a CCD, and the display portion 1310 functions as a finder that displays a subject as an electronic image. In addition, a light-receiving unit 1304 including an optical lens (imaging optical system), a CCD, and the like is provided on the front side (the back side in the drawing) of the case 1302. A photographer confirms a subject image displayed on the display portion 1310. When the photographer presses a shutter button 1306, an imaging signal of the CCD at a point in time of the pressing is transmitted and stored in a memory 1308. The vibrator device 1 used as, for example, an oscillator is embedded in the digital steel camera 1300.

The digital steel camera 1300 (electronic apparatus) includes the vibrator device 1. For this reason, it is possible to enjoy the effect of the above-described vibrator device 1 and to exhibit high reliability.

Meanwhile, the electronic apparatus according to the invention can be applied not only to the above-described personal computer, mobile phone, and digital steel camera but also to a smartphone, a tablet terminal, a timepiece (a smart watch is included), an ink jet type discharge apparatus (for example, an ink jet printer), a laptop type personal computer, a television, and wearable terminals such as a head mounted display (HMD), a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, an apparatus for a moving terminal base station, instruments (for example, instruments for vehicles, aircraft, and ships), a flight simulator, a network server, and the like.

Sixth Embodiment

Next, a vehicle according to a sixth embodiment of the invention will be described.

Figure 22:
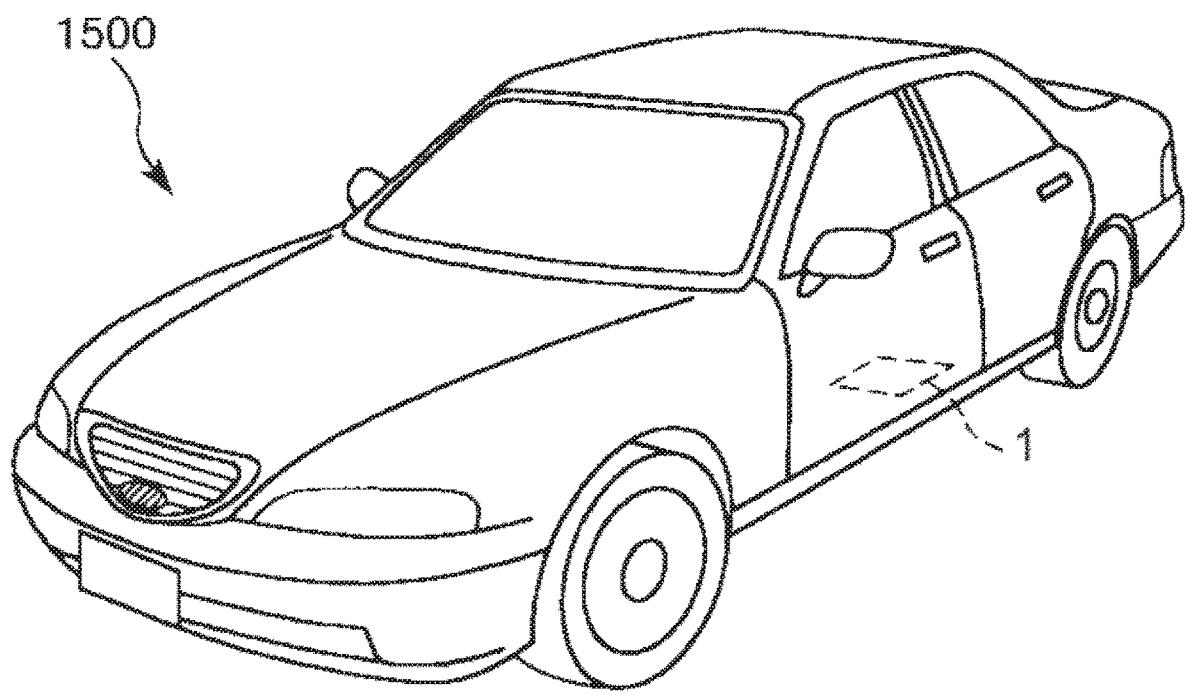
FIG. 22 is a perspective view illustrating a vehicle according to a sixth embodiment of the invention.

FIG. 22 is a perspective view illustrating a vehicle according to the sixth embodiment of the invention.

An automobile 1500 illustrated in FIG. 22 is an automobile to which a vehicle including the vibrator device according to the invention is applied. The vibrator device 1 used as, for example, an oscillator is embedded in the automobile 1500. The vibrator device 1 can be widely applied to an electronic control unit (ECU) such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric automobile, or a vehicle body position control system.

The automobile 1500 (vehicle) includes the vibrator device 1. For this reason, it is possible to enjoy the effect of the above-described vibrator device 1 and to exhibit high reliability.

Meanwhile, the vehicle is not limited to the automobile 1500, and can also be applied to an airplane, a ship, an Automated Guided Vehicle (AGV), a biped walking robot, and unmanned airplanes such as a drone.

The vibrator device, the method of manufacturing a vibrator device, the electronic apparatus, and the vehicle according to the invention have been described on the basis of the embodiments illustrated in the drawing. However, the invention is not limited thereto, and a configuration of each portion can be replaced with any configuration having the same function. In addition, any other components may be added to the invention. In addition, the invention may be a combination of any two or more configurations (features) in the embodiments.

Further, in the above-described embodiments, a configuration in which the vibrator device is applied to an oscillator has been described. However, the invention is not limited thereto, and the vibrator device may be applied to a physical quantity sensor capable of detecting a physical quantity, such as an acceleration and an angular velocity. In this case, an element having a drive vibration mode and a detection vibration mode in which excitation occurs in accordance with a received physical quantity is used as the vibrator element 2, and a driving circuit for driving the vibrator element 2 in the drive vibration mode and a detection circuit detecting a physical quantity on the basis of a signal obtained from the detection vibration mode of the vibrator element 2 may be formed in the circuit element 4.

The entire disclosure of Japanese Patent Application No. 2017-228419, filed Nov. 28, 2017 is expressly incorporated by reference herein.

What is claimed is:

1. A vibrator device comprising:
   a base;
   a circuit element that is attached to the base;
   a relay substrate that is attached to an active surface of the circuit element via a connection bump and has an outer peripheral edge smaller than that of the circuit element when viewed in a plan view of the active surface; and
   a vibrator element that is attached to the circuit element through the relay substrate,
   wherein the circuit element includes a terminal for frequency adjustment that is used for frequency adjustment of the vibrator element and is disposed in a region that does not overlap the relay substrate when viewed in the plan view of the active surface.

2. The vibrator device according to claim 1,
   wherein the terminal for frequency adjustment is positioned on an outer region of the relay substrate when viewed in the plan view.

3. The vibrator device according to claim 1,
   wherein the relay substrate includes
   a first portion that is attached to the base,
   a second portion,
   a first beam portion that connects the first portion and the second portion to each other on a first axis,
   a third portion, and
   a second beam portion that connects the second portion and the third portion to each other on a second axis intersecting the first axis, and
   the vibrator element is attached to the third portion.

4. The vibrator device according to claim 1, further comprising:
   a lid body that is bonded to the base so as to accommodate the vibrator element, the relay substrate, and the circuit element between the base and the lid body.

5. An electronic apparatus comprising the vibrator device according to claim 1.

6. A method of manufacturing a vibrator device, the method comprising:
   preparing a circuit element in which a terminal for frequency adjustment that is used for frequency adjustment of a vibrator element is disposed on an active surface, and disposing the vibrator element on the active surface so as not to overlap the terminal for frequency adjustment when viewed in a plan view of the active surface and a relay substrate having an outer peripheral edge smaller than that of the circuit element;
   disposing the vibrator element on the relay substrate;
   disposing the relay substrate on the active surface via a connection bump so as not to overlap the terminal for frequency adjustment when viewed in a plan view of the active surface; and
   processing an excitation electrode included in the vibrator element to adjust frequency of the vibrator element.

7. The method of manufacturing a vibrator device according to claim 6, further comprising, prior to the disposing of the vibrator element on the circuit element:
   preparing a substrate on which the vibrator element is formed;
   processing the excitation electrode to adjust the frequency of the vibrator element; and
   separating the vibrator element from the substrate.

8. The method of manufacturing a vibrator device according to claim 7,
   wherein the vibrator element includes a vibration substrate, a first excitation electrode disposed on one principal surface of the vibration substrate, and a second excitation electrode disposed on the other principal surface,
   the adjusting of the frequency of the vibrator element in a state where the vibrator element is disposed on the substrate includes processing the first excitation electrode, and
   the adjusting of the frequency of the vibrator element in a state where the vibrator element is disposed on the circuit element includes processing the second excitation electrode.

9. The method of manufacturing a vibrator device according to claim 6, further comprising:
   disposing the circuit element on a base after the frequency of the vibrator element is adjusted in a state where the vibrator element is disposed on the circuit element, and
   bonding a lid body to the base so as to accommodate the circuit element and the vibrator element between the base and the lid body.

10. A vehicle comprising the vibrator device according to claim 1.

11. A vibrator device comprising:
    a base;
    a circuit element that is attached to the base;
    a vibrator element that is arranged at an active surface of the circuit element and is attached to the circuit element, and
    a relay substrate that is positioned between the circuit element and the vibrator element;
    wherein the circuit element includes a terminal for frequency adjustment that is used for frequency adjustment of the vibrator element and is disposed in a region that does not overlap the vibrator element when viewed in the plan view of the active surface,
wherein the relay substrate includes
a first portion that is attached to the base,
a second portion,
a first beam portion that connects the first portion and the second portion to each other on a first axis,
a third portion, and
a second beam portion that connects the second portion and the third portion to each other on a second axis intersecting the first axis, and
the vibrator element is attached to the third portion.

* * * * *